US012813024B2

(12) United States Patent
Lee et al.

(10) Patent No.: US 12,813,024 B2
(45) Date of Patent: Nov. 24, 2026

(54) DISPLAY DEVICE AND METHOD OF MANUFACTURING THE SAME

(71) Applicant: Samsung Display Co., LTD., Yongin-si (KR)

(72) Inventors: Yonghan Lee, Yongin-si (KR); Heejun Yang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 312 days.

(21) Appl. No.: 18/385,933

(22) Filed: Nov. 1, 2023

(65) Prior Publication Data

US 2024/0266471 A1 Aug. 8, 2024

(30) Foreign Application Priority Data

Feb. 7, 2023 (KR) ........................ 10-2023-0016261

(51) Int. Cl.

| | |
|---|---|
| ***H01L 33/38*** | (2010.01) |
| ***H10H 20/831*** | (2025.01) |
| ***H10H 20/854*** | (2025.01) |
| ***H10W 90/00*** | (2026.01) |
| *H10H 20/01* | (2025.01) |

(52) U.S. Cl.

CPC ...... *H10H 20/8312* (2025.01); *H10H 20/854* (2025.01); *H10W 90/00* (2026.01); *H10H 20/032* (2025.01); *H10H 20/0362* (2025.01)

(58) Field of Classification Search

CPC ............. H10H 20/8312; H10H 20/854; H10H 20/032; H10H 20/0362; H10H 20/84; H10H 20/857; H10W 90/00; H10K 59/122; H10K 59/12; H10K 59/1201; H10K 59/873; H10K 59/124; H10K 59/88

See application file for complete search history.

(56) References Cited

U.S. PATENT DOCUMENTS

| | | | |
|---|---|---|---|
| 11,348,983 | B1 | 5/2022 | Choung et al. |
| 2021/0057504 | A1 | 2/2021 | Ko et al. |

(Continued)

FOREIGN PATENT DOCUMENTS

| | | | |
|---|---|---|---|
| JP | H11329741 | A | 11/1999 |
| JP | 2008135325 | A | 6/2008 |
| KR | 1020160127197 | A | 11/2016 |

(Continued)

*Primary Examiner* — Elmito Breval

(74) *Attorney, Agent, or Firm* — CANTOR COLBURN LLP

(57) ABSTRACT

A display device includes a substrate, a sub-pixel electrode disposed on the substrate, an insulating layer disposed on the sub-pixel electrode with an opening overlapping the sub-pixel electrode, a first metal bank layer disposed on the insulating layer with a first opening overlapping the sub-pixel electrode, a second metal bank layer disposed on the first metal bank layer with an opening overlapping at least a portion of the first opening, an intermediate insulating layer disposed between the first metal bank layer and the second metal bank layer, with an opening overlapping at least a portion of the first opening, and including an insulating material, an emission layer overlapping the sub-pixel electrode in the first opening of the first metal bank layer, an opposite electrode overlapping the emission layer in the first opening of the first metal bank layer, and a first inorganic encapsulation layer disposed on the opposite electrode.

12 Claims, 16 Drawing Sheets

(56) References Cited

U.S. PATENT DOCUMENTS

| | | | |
|---|---|---|---|
| 2021/0327981 | A1 | 10/2021 | Lee |
| 2022/0149126 | A1 | 5/2022 | Sung et al. |

FOREIGN PATENT DOCUMENTS

| | | | |
|---|---|---|---|
| KR | 1020190107257 | A | 9/2019 |
| KR | 20210022206 | A | 3/2021 |
| KR | 20220063774 | A | 5/2022 |
| KR | 20220087110 | A | 6/2022 |

DISPLAY DEVICE AND METHOD OF MANUFACTURING THE SAME

This application claims priority to Korean Patent Application No. 10-2023-0016261, filed on Feb. 7, 2023, and all the benefits accruing therefrom under 35 U.S.C. § 119, the content of which in its entirety is herein incorporated by reference.

BACKGROUND

1. Field

One or more embodiments relate to a display device and a method of manufacturing the display device.

2. Description of the Related Art

Display devices visually display data. Display devices may provide an image by using light-emitting diodes. The uses of display devices have diversified, and various designs for improving the quality of display devices have been attempted.

SUMMARY

One or more embodiments provide a display device and a method of manufacturing the display device.

According to one or more embodiments, a display device includes a substrate, a sub-pixel electrode disposed on the substrate, an insulating layer disposed on the sub-pixel electrode, where an opening is defined through the insulating layer to overlap the sub-pixel electrode, a first metal bank layer disposed on the insulating layer, where a first opening is defined through the first metal bank layer to overlap the sub-pixel electrode, a second metal bank layer disposed on the first metal bank layer, where an opening is defined through the second metal bank layer to overlap at least a portion of the first opening, an intermediate insulating layer disposed between the first metal bank layer and the second metal bank layer and including an insulating material, where an opening is defined through the intermediate insulating layer to overlap at least a portion of the first opening, an emission layer overlapping the sub-pixel electrode and disposed in the first opening of the first metal bank layer, an opposite electrode overlapping the emission layer and disposed in the first opening of the first metal bank layer, and a first inorganic encapsulation layer disposed on the opposite electrode.

In an embodiment, the intermediate insulating layer may include an inorganic insulating material.

In an embodiment, the intermediate insulating layer may include at least one selected from silicon oxide and silicon nitride.

In an embodiment, the display device may further include a protective layer disposed on at least a portion of the sub-pixel electrode.

In an embodiment, each of a width of the opening of the intermediate insulating layer and a width of the opening of the second metal bank layer may each be less than a width of the first opening of the first metal bank layer.

In an embodiment, the display device may further include an intermediate layer disposed between the first metal bank layer and the intermediate insulating layer, where an opening may be defined through the intermediate layer to overlap the first opening.

In an embodiment, the second metal bank layer may be in contact with an upper surface of the intermediate insulating layer, and may include a tip protruding toward a center of the first opening from a point at which a side surface of the intermediate layer is in contact with a bottom surface of the intermediate insulating layer.

In an embodiment, the intermediate insulating layer may be in contact with an upper surface of the intermediate layer, and may include a tip protruding toward a center of the first opening from a point at which a side surface of the intermediate layer is in contact with a bottom surface of the intermediate insulating layer.

In an embodiment, the intermediate layer may include at least one selected from indium tin oxide (ITO), indium zinc oxide (IZO), indium gallium zinc oxide (IGZO), indium tin zinc oxide (ITZO), zinc oxide (ZnO), aluminum doped zinc oxide (AZO), gallium doped zinc oxide (GZO), zinc tin oxide (ZTO), gallium tin oxide (GTO), and fluorine doped tin oxide (FTO).

In an embodiment, the display device may further include a dummy emission layer and a dummy opposite electrode, which are disposed on an upper surface of the second metal bank layer and are respectively disconnected from the emission layer and the opposite electrode.

In an embodiment, the first inorganic encapsulation layer may continuously extend to overlap upper portions and side surfaces of the dummy emission layer and the dummy opposite electrode, side surfaces of the first metal bank layer, the intermediate insulating layer, and the second metal bank layer, and an upper surface of the opposite electrode.

In an embodiment, the first inorganic encapsulation layer may be arranged only in the first opening of the first metal bank layer.

According to one or more embodiments, a method of manufacturing a display device includes forming a sub-pixel electrode on a substrate, forming a protective layer on at least a portion of the sub-pixel electrode, forming, on the sub-pixel electrode, an insulating layer with an opening formed therethrough to overlap the sub-pixel electrode, forming, on the insulating layer, a first metal bank layer with a first opening formed therethrough to overlap the sub-pixel electrode, forming, on the first metal bank layer, an intermediate layer with an opening formed therethrough to overlap the first opening, forming, on the intermediate layer, an intermediate insulating layer with an opening formed therethrough to overlap at least a portion of the first opening, forming, on the intermediate insulating layer, a second metal bank layer with an opening formed therethrough to overlap at least a portion of the first opening, forming an emission layer on the sub-pixel electrode in the first opening of the first metal bank layer, forming an opposite electrode on the emission layer in the first opening of the first metal bank layer, and forming a first inorganic encapsulation layer on the opposite electrode.

In an embodiment, the forming the protective layer, the forming the insulating layer, the forming the first metal bank layer, the forming the intermediate layer, the forming the intermediate insulating layer, and the forming the second metal bank layer may include providing, on the sub-pixel electrode, a material for forming the protective layer, providing a material for forming the insulating layer, on the material for forming the protective layer, providing a material for forming the first metal bank layer, on the material for forming the insulating layer, providing a material for forming the intermediate layer, on the material for forming the first metal bank layer, providing a material for forming the intermediate insulating layer, on the material for forming the intermediate layer, providing a material for forming the second metal bank layer, on the material for forming the intermediate insulating layer, and providing a photoresist on at least a portion of the material for forming the second metal bank layer.

In an embodiment, the forming the protective layer, the forming the insulating layer, the forming the first metal bank layer, the forming the intermediate layer, the intermediate insulating layer, and the forming the second metal bank layer may further include, after the providing the photoresist on at least a portion of the material for forming the second metal bank layer, forming the second metal bank layer and the intermediate insulating layer by etching the material for forming the second metal bank layer and the material for forming the intermediate insulating layer, forming the intermediate layer by etching the material for forming the intermediate layer, forming the first metal bank layer and the insulating layer by etching the material for forming the first metal bank layer and the material for forming the insulating layer, and forming the protective layer by etching the material for forming the protective layer.

In an embodiment, the second metal bank layer may be in contact with an upper surface of the intermediate insulating layer, and may include a tip protruding toward a center of the first opening from a point at which a side surface of the intermediate layer is in contact with a bottom surface of the intermediate insulating layer, and the intermediate insulating layer may be in contact with an upper surface of the intermediate layer, and may include a tip protruding toward the center of the first opening from the point at which the side surface of the intermediate layer is in contact with the bottom surface of the intermediate layer.

In an embodiment, the method may further providing a dummy emission layer and a dummy opposite electrode on an upper surface of the second metal bank layer to be respectively disconnected from the emission layer and the opposite electrode.

In an embodiment, the first inorganic encapsulation layer may continuously extend to overlap upper portions and side surfaces of the dummy emission layer and the dummy opposite electrode, side surfaces of the first metal bank layer, the intermediate insulating layer, and the second metal bank layer, and an upper surface of the opposite electrode.

In an embodiment, The first inorganic encapsulation layer may be provided only in the first opening of the first metal bank layer.

In an embodiment, the intermediate layer may include at least one selected from indium tin oxide (ITO), indium zinc oxide (IZO), indium gallium zinc oxide (IGZO), indium tin zinc oxide (ITZO), zinc oxide (ZnO), aluminum doped zinc oxide (AZO), gallium doped zinc oxide (GZO), zinc tin oxide (ZTO), gallium tin oxide (GTO), and fluorine doped tin oxide (FTO), and the intermediate insulating layer may include at least one selected from silicon oxide and silicon nitride.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
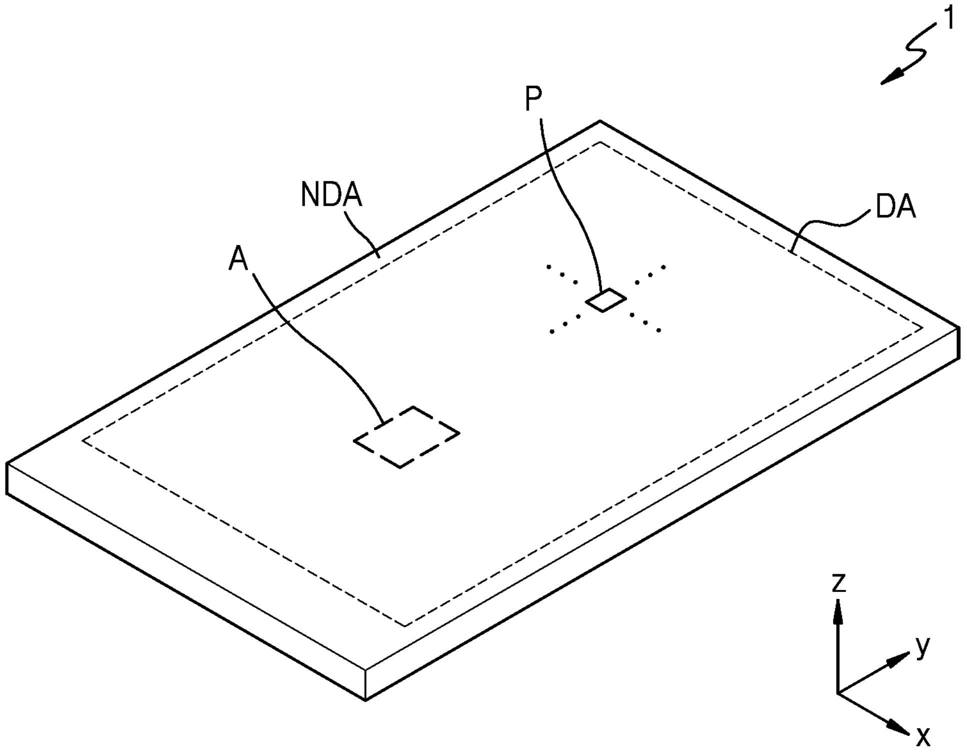
FIGS. 1 and 2 are perspective views schematically illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. In contrast, when an element is referred to as being "directly on" another element, there are no intervening elements present.

As the disclosure allows for various changes and numerous embodiments, certain embodiments will be illustrated in the drawings and described in detail in the written description. Hereinafter, effects and features of the disclosure and a method for accomplishing them will be described more fully with reference to the accompanying drawings, in which embodiments of the disclosure are shown. This disclosure may, however, be embodied in many different forms and should not be construed as limited to the embodiments set forth herein.

Hereinafter, embodiments will be described with reference to the accompanying drawings, where like reference numerals refer to like elements throughout and any repetitive detailed description thereof is omitted or simplified.

In an embodiment below, terms, such as "first" and "second," are used herein merely to describe a variety of elements, but the elements are not limited by the terms. Such terms are used only for the purpose of distinguishing one element from another element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or.". As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

In an embodiment below, terms, such as "include" or "comprise," may be construed to denote a certain characteristic or element, or a combination thereof, but may not be construed to exclude the existence of or a possibility of addition of one or more other characteristics, elements, or combinations thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Sizes of elements in the drawings may be exaggerated or reduced for convenience of explanation. For example, since sizes and thicknesses of elements in the drawings are arbitrarily illustrated for convenience of explanation, the disclosure is not limited thereto.

When an embodiment may be implemented differently, a certain process order may be performed differently from the described order. For example, two consecutively described processes may be performed substantially at the same time or performed in an order opposite to the described order.

In the present specification, "A and/or B" means A or B, or A and B. In addition, "at least one of A and B" or "at least one selected from A and B" means A or B, or A and B.

It will be understood that when a layer, region, or element is referred to as being "connected" to another layer, region, or element, it may be "directly connected" to the other layer, region, or element or may be "indirectly connected" to the other layer, region, or element with other layer, region, or element located therebetween. For example, it will be understood that when a layer, region, or element is referred to as being "electrically connected" to another layer, region, or element, it may be "directly electrically connected" to the other layer, region, or element or may be "indirectly electrically connected" to other layer, region, or element with other layer, region, or element located therebetween.

The x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
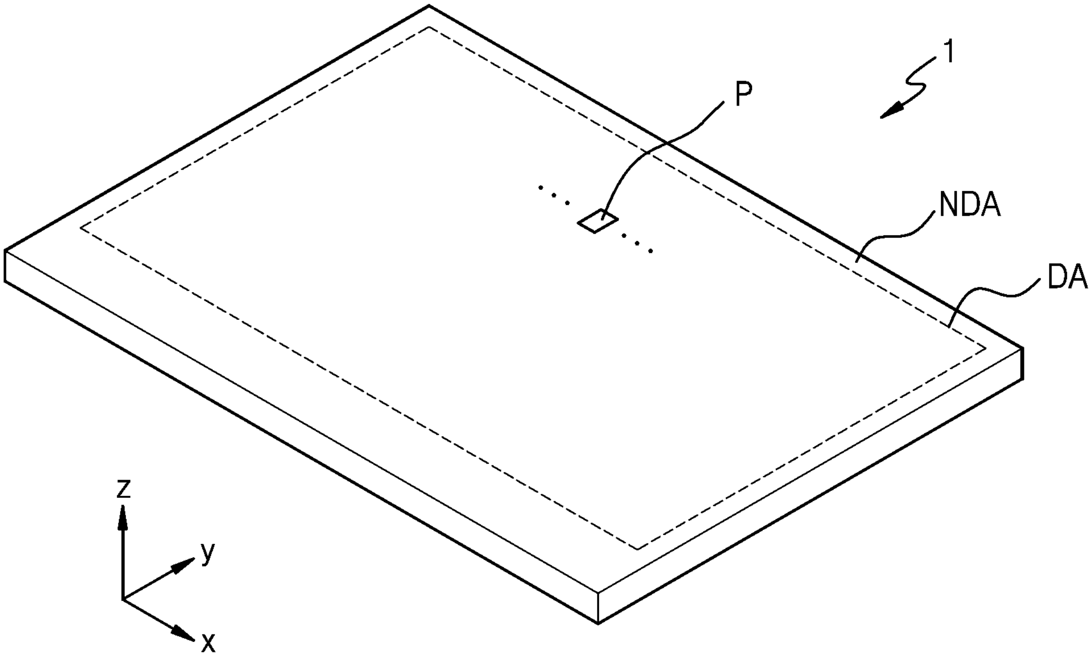

FIGS. 1 and 2 are perspective views schematically illustrating a display device 1 according to an embodiment.

Referring to FIGS. 1 and 2, an embodiment of the display device 1 may include a display area DA and a non-display area NDA located outside the display area DA. The display area DA may display an image through sub-pixels P arranged in the display area DA. The non-display area NDA is a non-display area which is arranged outside the display area DA and on which an image is not displayed, and may entirely surround the display area DA. A driver or the like for providing electrical signals or power to the display area DA may be arranged in the non-display area NDA. A pad, which is an area to which an electronic element or a printed circuit board may be electrically connected, may be arranged in the non-display area NDA.

FIG. 1 shows an embodiment having a shape of a polygon (e.g., rectangle) in which a length of the display area DA in an x direction is smaller than a length in a y direction. FIG. 2 shows an alternative embodiment having a shape of a polygon (e.g., rectangle) in which the length of the y direction of the display area DA is smaller than the length in the x direction. FIGS. 1 and 2 show embodiments where the display area DA has a substantially rectangular shape, but one or more embodiments are not limited thereto. In an alternative embodiment, the display area DA may have various shapes, such as an N-gon (where N is a natural number of 3 or greater), a circle, or an ellipse. In an embodiment, as shown in FIGS. 1 and 2, a corner portion of the display area DA has a shape including a vertex where straight lines meet. In an alternative embodiment, the display area DA may be a polygon with round corners.

Hereinafter, for convenience of description, embodiments in which the display device 1 is an electronic device, such as a smartphone, will be described, but the display device 1 of one or more embodiments is not limited thereto. The display device 1 may be applied not only to portable electronic devices, such as mobile phones, smartphones, tablet personal computers (PCs), mobile communication terminals, electronic books, portable multimedia players (PMP), navigation devices, and ultra mobile PCs (UMPCs), but also to televisions, laptops, monitors, billboards, and the Internet of Things (IoT). In addition, the display device according to an embodiment may be applied to a wearable device, such as smart watches, watch phones, glasses-type displays, and head-mounted displays (HMDs). In addition, the display device 1 according to an embodiment may be applied to instrument panels of a vehicle, center information displays (CIDs) arranged on a center fascia or a dashboard of a vehicle, room mirror displays replacing a side mirror of a vehicle, and display screens arranged on the back of the front seat as an entertainment for the back seat of a vehicle.

Figure 3:
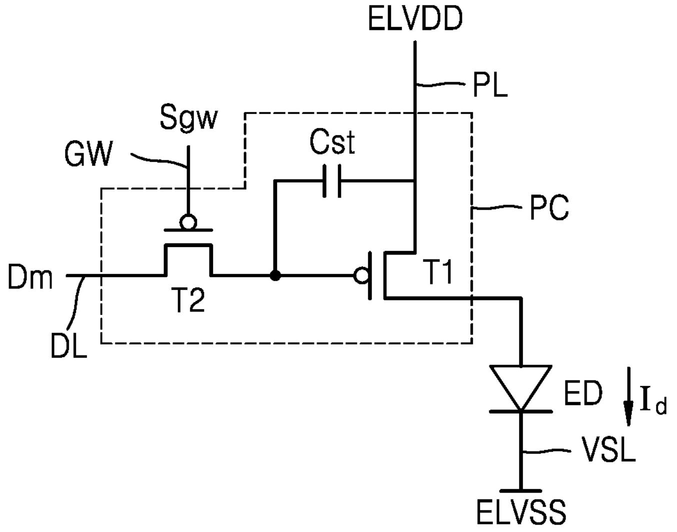
FIGS. 3 and 4 are equivalent circuit diagrams schematically illustrating a light-emitting diode corresponding to any one sub-pixel of a display device according to an embodiment and a sub-pixel circuit electrically connected to the light-emitting diode.
Figure 4:
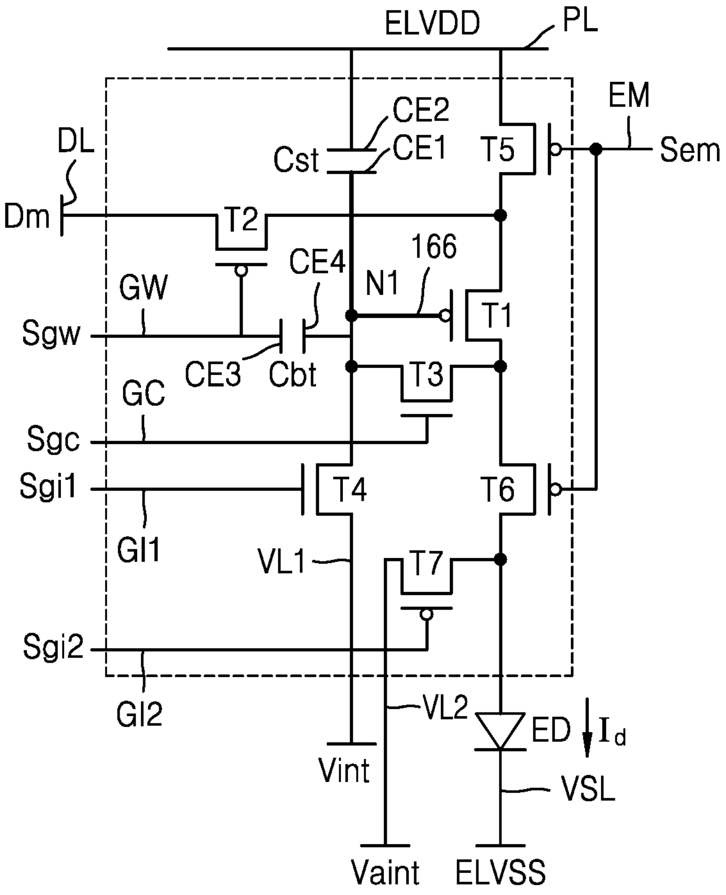

FIGS. 3 and 4 are equivalent circuit diagrams schematically illustrating a light-emitting diode ED corresponding to any one sub-pixel of a display device according to an embodiment and a sub-pixel circuit PC electrically connected to the light-emitting diode ED.

Referring to FIG. 3, in an embodiment, the light-emitting diode ED is electrically connected to the sub-pixel circuit PC, and the sub-pixel circuit PC includes a first transistor T1, a second transistor T2, and a storage capacitor Cst. A sub-pixel electrode (e.g., anode) of the light-emitting diode ED may be electrically connected to the first transistor T1, and an opposite electrode (e.g., a cathode) may be electrically connected to an auxiliary line VSL and may receive a voltage corresponding to a common voltage ELVSS through the auxiliary line VSL.

The second transistor T2 transfers a data signal Dm received through a data line DL to the first transistor T1 in response to a scan signal Sgw received through a scan line GW.

The storage capacitor Cst is connected to the second transistor T2 and a driving voltage line PL, and stores a voltage corresponding to a difference between a voltage received from the second transistor T2 and a driving voltage ELVDD supplied to the driving voltage line PL.

The first transistor T1 is connected to the driving voltage line PL and the storage capacitor Cst and may control a driving current $I_d$ flowing from the driving voltage line PL to the light-emitting diode ED in correspondence with a voltage value stored in the storage capacitor Cst. The light-emitting diode ED may emit light having a certain luminance corresponding to the driving current $I_d$.

Although FIG. 3 shows an embodiment where the sub-pixel circuit PC includes two transistors and one storage thin-film transistor, one or more embodiments are not limited thereto.

Referring to FIG. 4, in an alternative embodiment, the sub-pixel circuit PC may include seven transistors and two capacitors.

The sub-pixel circuit PC may include first to seventh transistors T1, T2, T3, T4, T5, T6, and T7, a storage capacitor Cst, and a boost capacitor Cbt. As another embodiment, the sub-pixel circuit PC may not include the boost capacitor Cbt. A sub-pixel electrode (e.g., anode) of the light-emitting diode ED may be electrically connected to the first transistor T1 via the sixth transistor T6, and the opposite electrode (e.g., cathode) may be electrically connected to the auxiliary line VSL and receive a voltage corresponding to the common voltage ELVSS through the auxiliary line VSL.

Some of the first to seventh transistors T1, T2, T3, T4, T5, T6, and T7 may be n-channel metal-oxide-semiconductor field-effect transistors (MOSFETs; NMOSs), and the others may be p-channel MOSFETs (PMOSs). In an embodiment, as shown in FIG. 4, the third and fourth transistors T3 and T4 may be NMOSs, and the others may be PMOSs. In an embodiment, for example, the third and fourth transistors T3 and T4 may be NMOSs including an oxide-based semiconductor material, and the others may be PMOSs including a silicon-based semiconductor material. In an alternative embodiment, the third, fourth, and seventh transistors T3, T4, and T7 may be NMOSs, and the others may be PMOSs.

The first to seventh transistors T1, T2, T3, T4, T5, T6, and T7, the storage capacitor Cst, and the boost capacitor Cbt may be connected to a signal line. The signal line may include a scan line GW, an emission control line EM, a compensation gate line GC, a first initialization gate line GI1, a second initialization gate line GI2, and a data line DL. The sub-pixel circuit PC may be electrically connected to voltage lines, for example, the driving voltage PL, a first initialization voltage line VL1, and a second initialization voltage line VL2.

The first transistor T1 may be a driving transistor. A first gate electrode of the first transistor may be connected to the storage capacitor Cst, a first electrode of the first transistor T1 may be electrically connected to the driving voltage line PL via the fifth transistor T5, and a second electrode of the first transistor T1 may be electrically connected to a first electrode (e.g., anode) of the light-emitting diode ED via the sixth transistor T6. One of the first electrode and the second electrode of the first transistor T1 may be a source electrode and the other one thereof may be a drain electrode. The first transistor T1 may supply the driving current $I_d$ to the light-emitting diode ED based on a switching operation of the second transistor T2.

The second transistor T2 may be a switching transistor. A second gate electrode of the second transistor T2 is connected to the scan line GW, a first electrode of the second transistor T2 is connected to the data line DL, a second electrode of the second transistor T2 is connected to the first electrode of the first transistor T1 and electrically connected to the driving voltage line PL via the fifth transistor T5. One of the first electrode and the second electrode of the second transistor T2 may be a source electrode and the other one thereof may be a drain electrode. The second transistor T2 is turned on in response to the scan signal Sgw received through the scan line GW and perform a switching operation for transmitting the data signal Dm received via the data line DL to the first electrode of the first transistor T1.

The third transistor T3 may be a compensation transistor that compensates for a threshold voltage of the first transistor T1. A third gate electrode of the third transistor T3 is connected to a compensation gate line GC. A first electrode of the third transistor T3 is connected to a lower electrode CE1 of the storage capacitor Cst and the first gate electrode of the first transistor T1 through a node connection line 166. The first electrode of the third transistor T3 may be connected to the fourth transistor T4. A second electrode of the third transistor T3 is electrically connected to the first electrode (e.g., anode) of the light-emitting diode ED via the sixth transistor T6 while being connected to the second electrode of the first transistor T1. One of the first electrode and the second electrode of the third transistor T3 may be a source electrode and the other one thereof may be a drain electrode.

The third transistor T3 may be turned on in response to the compensation signal Sgc received through the compensation gate line GC and electrically connect the first gate electrode and the second electrode (e.g., drain electrode) of the first transistor T1 to each other, to diode-connect the first transistor T1.

The fourth transistor T4 may be a first initialization transistor that initializes the first gate electrode of the first transistor T1. A fourth gate electrode of the fourth transistor T4 is connected to the first initialization gate line GI1. A first electrode of the fourth transistor T4 is connected to the first initialization voltage line VL1. A second electrode of the fourth transistor T4 may be connected to the lower electrode CE1 of the storage capacitor Cst, the first electrode of the third transistor T3, and the first gate electrode of the first transistor T1. One of the first electrode and the second electrode of the fourth transistor T4 may be a source electrode and the other one thereof may be a drain electrode. The fourth transistor T4 may be turned on in response to a first initialization signal Sgi1 received through the first initialization gate line GI1 and perform an initialization operation for initializing a voltage of the first gate electrode of the first transistor T1 by transferring a first initialization voltage Vint to the first gate electrode of the first transistor T1.

The fifth transistor T5 may be an operation control transistor. A fifth gate electrode of the fifth transistor T5 is connected to the emission control line EM, a first electrode of the fifth transistor T5 is connected to the driving voltage line PL, and a second electrode of the fifth transistor T5 is connected to the first electrode of the first transistor T1 and the second electrode of the second transistor T2. One of the first electrode and the second electrode of the fifth transistor T5 may be a source electrode and the other one thereof may be a drain electrode.

The sixth transistor T6 may be an emission control transistor. A sixth gate electrode of the sixth transistor T6 is connected to the emission control line EM, a first electrode of the sixth transistor T6 is connected to the second electrode of the first transistor T1 and the second electrode of the third transistor T3, and a second electrode of the sixth transistor T6 is electrically connected to a second electrode of the sixth transistor and the first electrode (e.g., anode) of the light-emitting diode ED. One of the first electrode and the second electrode of the sixth transistor T6 may be a source electrode and the other one thereof may be a drain electrode.

The fifth transistor T5 and the sixth transistor T6 may be simultaneously turned on in response to an emission control signal Sem received through the emission control line EM, so that the driving voltage ELVDD is transferred to the light-emitting diode ED and the driving current $I_d$ flows through the light-emitting diode ED.

The seventh transistor T7 may be a second initialization transistor that initializes the first electrode (e.g., anode) of the light-emitting diode ED. A seventh gate electrode of the seventh transistor T7 is connected to the second initialization gate line GI2. A first electrode of the seventh transistor T7 is connected to the second initialization voltage line VL2. The second electrode of the seventh transistor T7 is connected to the second electrode of the sixth transistor T6 and the first electrode (e.g., anode) of the light-emitting diode ED. The seventh transistor T7 may be turned on in response to a second initialization signal Sgi2 received through the second initialization gate line GI2 to transfer a second initialization voltage Vaint to the first electrode (e.g., anode) of the light-emitting diode ED and initialize the first electrode of the light-emitting diode ED.

In some embodiments, the second initialization voltage line VL2 may be a next scan line. In an embodiment, for example, the second initialization gate line GI2 connected to the seventh transistor T7 of the sub-pixel circuit PC arranged in an i-th row (i is a natural number) may correspond to a scan line of the sub-pixel circuit PC arranged in an (i+1)-th row. In an alternative embodiment, the second initialization voltage line VL2 may be the emission control line EM. In an embodiment, for example, the emission control line EM may be electrically connected to the fifth to seventh transistors T5, T6, and T7.

The storage capacitor Cst includes a lower electrode CE1 and an upper electrode CE2. The lower electrode CE1 of the storage capacitor Cst is connected to the first gate electrode of the first transistor T1, and the upper electrode CE2 of the storage capacitor Cst is connected to the driving voltage line PL. The storage capacitor Cst may store charge corresponding to a difference between a voltage of the first gate electrode of the first transistor T1 and the driving voltage ELVDD.

The boost capacitor Cbt includes a third electrode CE3 and a fourth electrode CE4. The third electrode CE3 may be connected to the second gate electrode of the second transistor T2 and the scan line GW, and the fourth electrode CE4 may be connected to the first electrode of the third transistor T3 and the node connection line 166. The boost capacitor Cbt may increase a voltage of a first node N1 when the scan signal Sgw is turned off, and when the voltage of the first node N1 increases, the black gradation may be clearly expressed.

The first node N1 may be a region to which the first gate electrode of the first transistor T1, the first electrode of the third transistor T3, the second electrode of the fourth transistor T4, and the fourth electrode CE4 of the boost capacitor Cbt are connected.

In an embodiment, as shown in FIG. 4, the third and fourth transistors T3 and T4 are NMOSs, and the first, second, and fifth to seventh transistors T1, T2, T5, T6, and T7 are PMOSs. The first transistor T1, which directly affects a brightness of a display apparatus on which an image is displayed, is configured to include a highly reliable polycrystalline silicon semiconductor layer, and through this, a high-resolution display device may be implemented.

Although FIG. 4 shows an embodiment where some transistors are NMOSs and other ones are PMOSs, one or more embodiments are not limited thereto. In an alternative embodiment, the sub-pixel circuit PC includes three transistors, but may be variously modified, such as that all three transistors are all NMOSs.

Figure 5A:
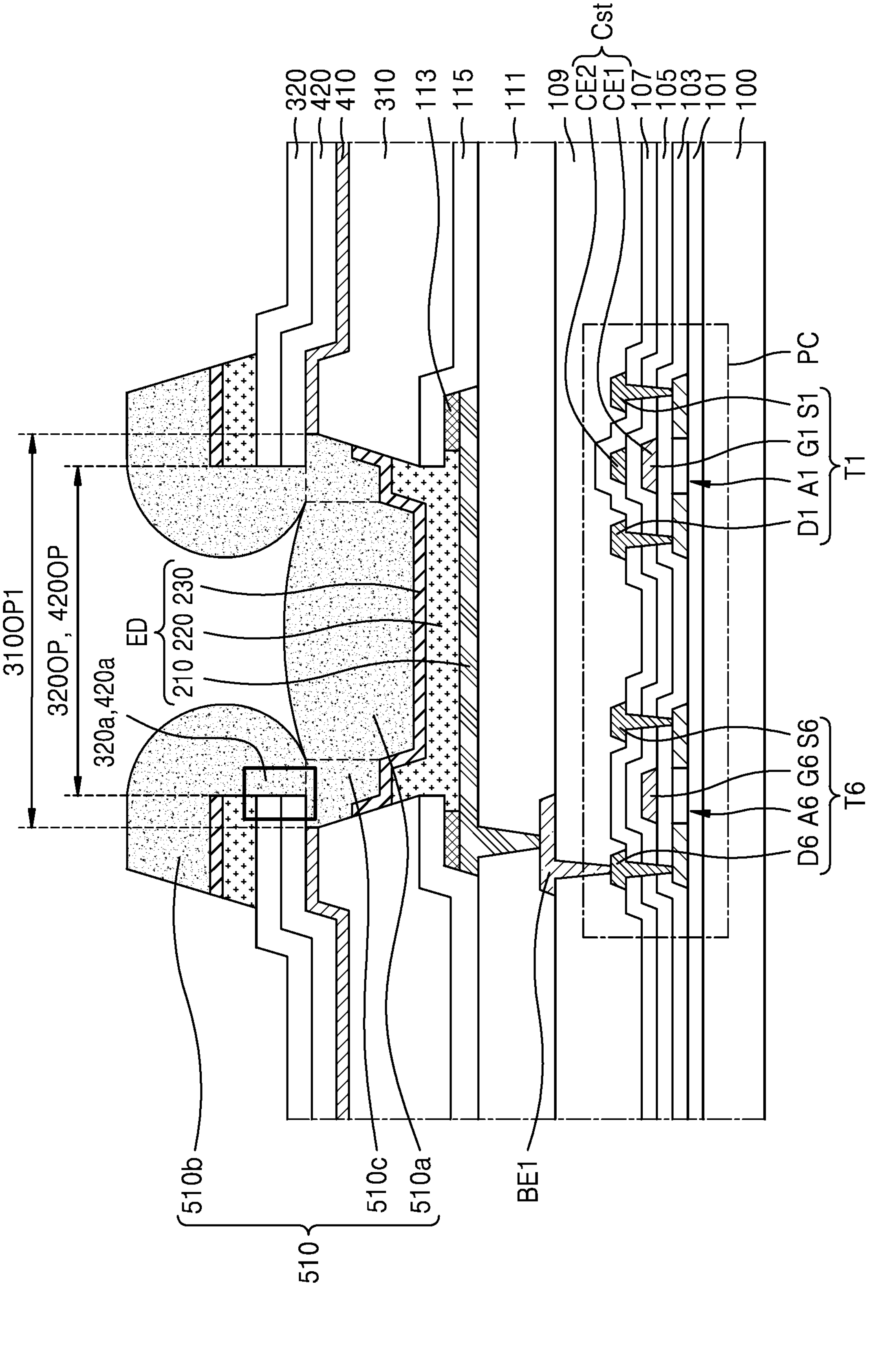
FIGS. 5A and 5B are schematic cross-sectional views of a display device according to an embodiment.
Figure 5B:
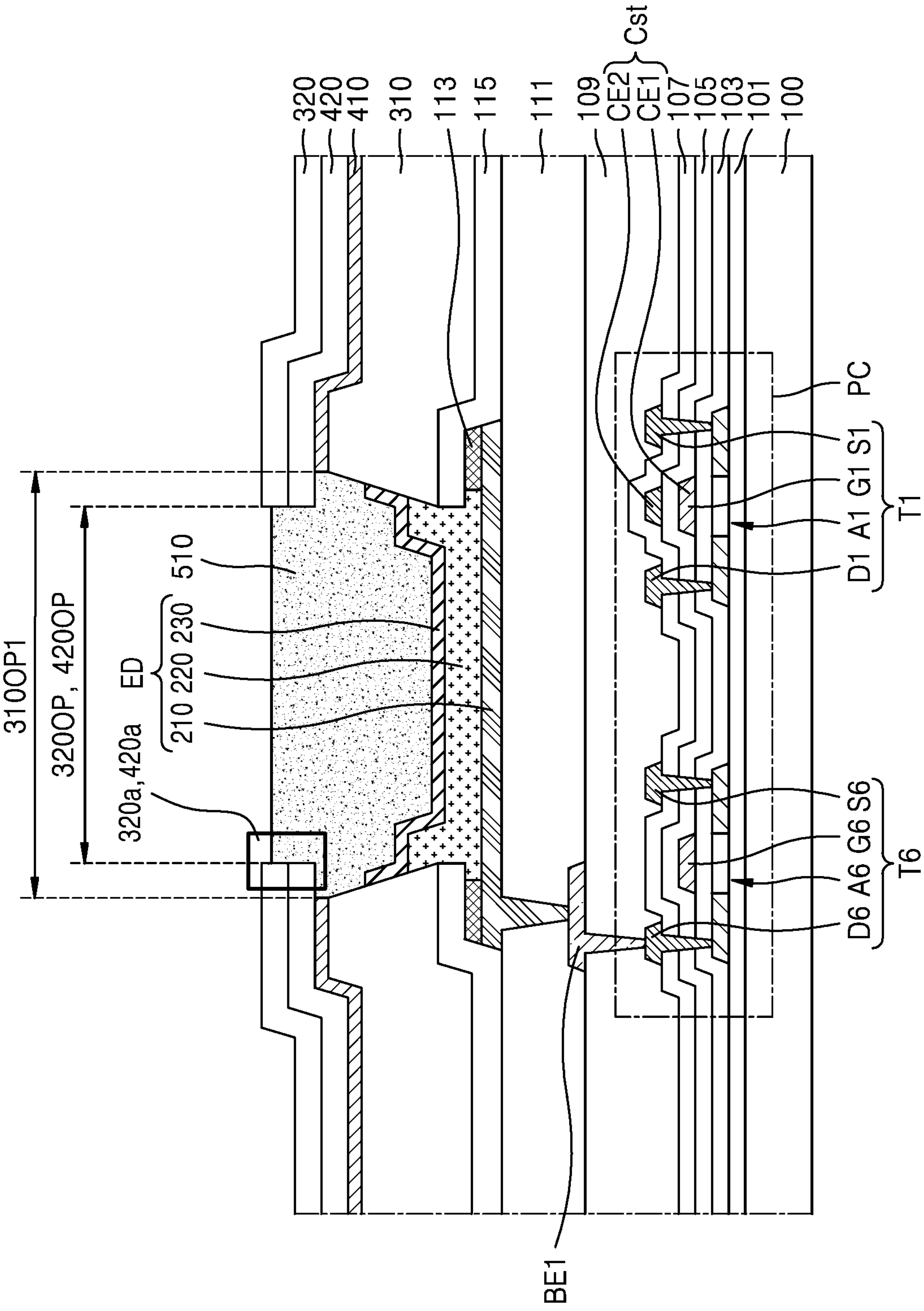

FIGS. 5A and 5B are schematic cross-sectional views of a display device according to an embodiment.

Referring to FIGS. 5A and 5B, the sub-pixel circuit PC may be disposed or formed on a substrate 100. The substrate 100 may include a glass material or a polymer resin. Although not shown, the substrate 100 may include a structure in which a base layer including a polymer resin and an inorganic barrier layer are stacked. The polymer resin may include at least one selected from polyethersulfone (PES), polyacrylate (PAR), polyetherimide (PEI), polyethylene naphthalate (PEN), polyethyelene terephthalate (PET), polyphenylene sulfide (PPS), polyarylate, polyimide (PI), polycarbonate, cellulose triacetate (TAC), and cellulose acetate propionate (CAP).

A buffer layer 101 may be disposed on an upper surface of the substrate 100. The buffer layer 101 may prevent impurities from penetrating into a semiconductor layer of a transistor. The buffer layer 101 may include an inorganic material, such as silicon nitride, silicon oxynitride, and silicon oxide, and may have a single-layer or multi-layer structure including at least one selected from the inorganic insulating materials described above.

The sub-pixel circuit PC may be disposed on the buffer layer 101. In an embodiment, the sub-pixel circuit PC may include a plurality of transistors and a storage capacitor, as shown in FIG. 3 or FIG. 4 above. For convenience of illustration and description, FIGS. 5A and 5B show only the first transistor T1, the sixth transistor T6, and the storage capacitor Cst of the sub-pixel circuit PC.

The first transistor T1 may include a first semiconductor layer A1 on the buffer layer 101 and a first gate electrode G1 overlapping a channel region of the first semiconductor layer A1. The first semiconductor layer A1 may include a silicon-based semiconductor material, such as polysilicon. The first semiconductor layer A1 may include the channel region and a first region and a second region disposed on opposite sides of the channel region. The first region and the second region are regions including higher concentrations of impurities than the channel region, and one of the first region and the second region may correspond to a source region and the other one thereof may correspond to a drain region.

The sixth transistor T6 may include a sixth semiconductor layer A6 on the buffer layer 101 and the sixth gate electrode G6 overlapping a channel region of the sixth semiconductor layer A6. The sixth semiconductor layer A6 may include a silicon-based semiconductor material, such as polysilicon. The sixth semiconductor layer A6 may include the channel region and a first region and a second region arranged at opposite sides of the channel region. The first region and the second region are regions including higher concentrations of impurities than the channel region, and one of the first region and the second region may correspond to a source region and the other one thereof may correspond to a drain region.

The first gate electrode G1 and the sixth gate electrode G6 may include a conductive material including molybdenum (Mo), aluminum (Al), copper (Cu), titanium (Ti), or the like, and may have a single-layer or multi-layer structure including at least one selected from the materials described above. A first gate insulating layer 103 for electrical insulation from the first semiconductor layer A1 and the sixth semiconductor layer A6 may be disposed under the first gate electrode G1 and the sixth gate electrode G6. The first gate insulating layer 103 may include an inorganic insulating material, such as silicon nitride, silicon oxynitride, and silicon oxide, and may have a single-layer or multi-layer structure including at least one selected from the inorganic insulating materials described above.

The storage capacitor Cst may include a lower electrode CE1 and an upper electrode CE2. In an embodiment, the lower electrode CE1 of the storage capacitor Cst may include the first gate electrode G1. In such an embodiment, a first gate electrode GE1 may include the lower electrode CE1 of the storage capacitor Cst. In an embodiment, for example, the first gate electrode G1 and the lower electrode CE1 of the storage capacitor Cst may be integrated with each other or integrally formed with each other as a single unitary and indivisible part.

A first interlayer insulating layer 105 may be disposed between the lower electrode CE1 and the upper electrode CE2 of the storage capacitor Cst. The first interlayer insulating layer 105 may include an inorganic insulating material, such as silicon oxide, silicon nitride, or silicon oxynitride, and may have a single-layer or multi-layer structure including at least one selected from the inorganic insulating materials described above.

The upper electrode CE2 of the storage capacitor Cst may include a low-resistance conductive material, such as Mo, Al, Cu, and/or Ti, and may include a single-layer or multi-layer structure including at least one selected from the materials described above.

A second interlayer insulating layer 107 may be disposed on the storage capacitor Cst. The second interlayer insulating layer 107 may include an inorganic insulating material, such as silicon oxide, silicon nitride, or silicon oxynitride, and may have a single-layer or multi-layer structure including at least one selected from the inorganic insulating materials described above.

A first source electrode S1 and/or a first drain electrode D1 electrically connected to the first semiconductor layer A1 of the first transistor T1 may be disposed on the second interlayer insulating layer 107. A sixth source electrode S6 and/or a sixth drain electrode D6 electrically connected to the sixth semiconductor layer A6 of the sixth transistor T6 may be disposed on the second interlayer insulating layer 107. The first and sixth source electrodes S1 and S6 and/or the first and sixth drain electrodes may include Al, Cu, and/or Ti, and may have a single-layer or multi-layer structure including at least one selected from the materials described above.

A first organic insulating layer 109 may be disposed on the sub-pixel circuit PC. The first organic insulating layer 109 may include an organic insulating material, such as acrylic, benzocyclobutene (BCB), polyimide, or hexamethyldisiloxane (HMDSO).

A connection electrode BE1 may be disposed on the first organic insulating layer 109. The connection electrode BE1 may include Al, Cu, and/or Ti, and may have a single-layer or multi-layer structure including at least one selected from including the materials described above.

A second organic insulating layer 111 may be arranged between the connection electrode BE1 and a sub-pixel electrode 210. The second organic insulating layer 111 may include an organic insulating material, such as acrylic, BCB, polyimide, or HMDSO. According to an embodiment, as described with reference to FIGS. 5A and 5B, the sub-pixel circuit PC and the sub-pixel electrode 210 are electrically connected through the connection electrode BE1, but according to an alternative embodiment, the connection electrode BE1 may be omitted, and one organic insulating layer may be located between the sub-pixel circuit PC and the sub-pixel electrode 210. Alternatively, three or more organic insulating layers may be located between the sub-pixel circuit PC and the sub-pixel electrode 210, and the sub-pixel circuit PC and the sub-pixel electrode 210 are electrically connected to each other through a plurality of connection metals.

The sub-pixel electrode 210 may be formed or disposed on the second organic insulating layer 111. The sub-pixel electrode 210 may be formed to be a (semi-)transparent electrode or a reflective electrode. In an embodiment where the sub-pixel electrode 210 is formed as a (semi-)transparent electrode, for example, indium tin oxide (ITO), indium zinc oxide (IZO), zinc oxide (ZnO), indium oxide ($In_2O_3$), indium gallium oxide (AZO), or aluminum zinc oxide (AZO). In an embodiment where the sub-pixel electrode 210 is formed as a reflective electrode, a reflective film may be formed of silver (Ag), magnesium (Mg), Al, platinum (Pt), palladium (Pd), gold (Au), nickel (Ni), neodymium (Nd), iridium (Ir), chromium (Cr), or a compound thereof, and on the reflective film, a film formed of ITO, IZO, ZnO, or $In_2O_3$ may be formed. In an embodiment, the sub-pixel electrode 210 may have a structure in which an ITO layer, an Ag layer, and an ITO layer are sequentially stacked. The sub-pixel electrode 210 may be electrically connected to the connection electrode BE1 through a via hole defined in the second organic insulating layer 111.

A protective layer 113 may be disposed or formed on the sub-pixel electrode. The protective layer 113 may be disposed on at least a portion of the sub-pixel electrode 210. In an embodiment, the protective layer 113 may overlap an outer portion of the sub-pixel electrode 210 and may be provided with an opening defined therethrough to overlap an inner portion of the sub-pixel electrode 210. In the disclosure, “the outer portion (or peripheral portion) of A” refers to “a portion of A including an edge A,” and “the inner portion of A” refers to another portion of A surrounded by the outer portion (or peripheral portion) described above. The protective layer 113 may be formed together with (via a same process as) the sub-pixel electrode 210. In an embodiment, for example, the sub-pixel electrode 210 and the protective layer 113 may be formed by using a same mask. The protective layer 113 may prevent the sub-pixel electrode 210 from being damaged by gas or liquid materials used in various etching processes or ashing processes included in a manufacturing process of the display device. The protective layer 113 may include a conductive oxide, such as ITO, IZO, indium gallium zinc oxide (IGZO), indium tin zinc oxide (ITZO), ZnO, aluminum doped zinc oxide (AZO), gallium doped zinc oxide (GZO), zinc tin oxide (ZTO), gallium tin oxide (GTO), and fluorine doped tin oxide (FTO).

An insulating layer 115 may be disposed on the sub-pixel electrode 210. The insulating layer 115 may be provided with an opening defined therethrough to overlap the sub-pixel electrode 210. In such an embodiment, the sub-pixel electrode 210 may be arranged in an opening defined in the insulating layer 115. The protective layer 113 may be located between the sub-pixel electrode 210 and the insulating layer 115.

The insulating layer 115 may include an inorganic insulating material, such as silicon oxide, silicon nitride, and silicon oxynitride, and may have a single-layer or multi-layer structure including at least one selected from the inorganic insulating materials described above. The insulating layer 115 may electrically insulate a first metal bank layer 310 from the sub-pixel electrode 210. The insulating layer 115 may be entirely formed on the substrate 100. In an embodiment, for example, the insulating layer 115 may pass through an overlapping structure of the sub-pixel electrode 210 and the protective layer 113 and be in direct contact with an upper surface of the second organic insulating layer 111 on which the protective layer 113 does not exist. The insulating layer 115 may cover each of side surfaces of the sub-pixel electrode 210 and the protective layer 113. The insulating layer 115 may include an inorganic insulating material. In an embodiment where the insulating layer 115 includes an inorganic insulating material, compared to a case in which the insulating layer 115 includes an organic insulating material, the quality of the light-emitting diode may be effectively prevented or minimized from being lowered due to gas emitted from the insulating layer, which is an organic insulating material, during the manufacturing process of the display device. However, one or more embodiments are not limited thereto.

An emission layer 220 may be in direct contact with the sub-pixel electrode 210 through the opening of the insulating layer 115. In an embodiment, for example, an inner portion of the emission layer 220 may overlap and be in contact with the sub-pixel electrode 210, and an outer portion may extend onto the insulating layer 115 and overlap and be in contact with the insulating layer 115. The emission layer 220 located between an opposite electrode 230 and the sub-pixel electrode 210 may emit light of a first color. A width of the opening of the insulating layer 115 may correspond to a width of an emission region of a first light-emitting diode.

Although not shown, in an embodiment, a first common layer may be arranged to be in contact with a bottom surface of the emission layer 220. In such an embodiment, the first common layer may be located between the emission layer 220 and the sub-pixel electrode 210. In an embodiment, a second common layer may be arranged to be in contact with an upper surface of the emission layer 220. In such an embodiment, the second common layer may be arranged between the emission layer 220 and the opposite electrode 230. The emission layer 220 may be located between the first common layer and the second common layer.

In an embodiment, the emission layer 220 may include a polymer or a low-molecular weight organic material that emits light of a certain color (red, green, or blue). In an alternative embodiment, the emission layer 220 may include an inorganic material or quantum dots.

The first common layer may include a hole transport layer (HTL) and/or a hole injection layer (HIL). The second common layer may include an electron transport layer (ETL) and/or an electron injection layer (EIL). The first common layer and the second common layer may include an organic material.

The opposite electrode 230 may include a conductive material having a low work function. In an embodiment, for example, the opposite electrode 230 may include a (semi-)transparent layer including Ag, magnesium (Mg), Al, Pt, Pd, gold (Au), Ni, Nd, Ir, Cr, lithium (Li), calcium (Ca), or an alloy thereof. Alternatively, the opposite electrode 230 may further include a layer, such as ITO, IZO, ZnO, or $In_2O_3$, on the (semi-)transparent layer including the materials described above.

A metal bank layer may be disposed on the insulating layer 115. The metal bank layer may include a first metal bank layer 310 and a second metal bank layer 320. The first metal bank layer 310 may be provided with a first opening 310OP defined therethrough to overlap the sub-pixel electrode 210. In such an embodiment, the sub-pixel electrode 210, the emission layer 220, and the opposite electrode 230 may be arranged in the first opening 310OP of the first metal bank layer 310. The first metal bank layer 310 may include Al. The second metal bank layer 320 may be disposed on the first metal bank layer 310. The second metal bank layer 320 may be provided with an opening 320OP defined therethrough to overlap at least a portion of the first opening 310OP1 of the first metal bank layer 310. In such an embodiment, the sub-pixel electrode 210, the emission layer 220, and the opposite electrode 230 may be arranged in the opening 320OP of the second metal bank layer 320. The second metal bank layer 320 may include Ti. In FIGS. 5A and 5B, a metal bank layer includes two metal bank layers. However, one or more embodiments are not limited thereto. In an alternative embodiment, the metal bank layer may further include a first metal bank layer, a second metal bank layer on the first metal bank layer, and a third metal bank layer under the first metal bank layer.

A thickness of the first metal bank layer 310 may be greater than a thickness of the second metal bank layer 320. In an embodiment, the thickness of the first metal bank layer 310 may be greater than about 5 times or less than about 10 times the thickness of the second metal bank layer 320. In an alternative embodiment, the thickness of the first metal bank layer 310 may be about 6 times or greater than, about 7 times or greater than, or about 8 times or greater than the thickness of the second metal bank layer 320.

In an embodiment, an intermediate insulating layer 420 may be located between the first metal bank layer 310 and the second metal bank layer 320. The intermediate insulating layer 420 may include an insulating material. The intermediate insulating layer 420 may include an inorganic insulating material. In an embodiment, for example, the intermediate insulating layer 420 may include at least one selected from silicon oxide and silicon nitride. The intermediate insulating layer 420 may be provided with an opening defined therethrough to overlap at least a portion of the first opening 310OP1 of the first metal bank layer 310. The intermediate insulating layer 420 and an end of the second metal bank layer 320 arranged to be in contact with an upper surface of the intermediate insulating layer 420 may be aligned with each other or located on a same line or plane. In such an embodiment, a width of an opening of a width of the opening 420OP of the intermediate insulating layer 420 may be equal to a width of the opening 320OP of the second metal bank layer 320 arranged to be in contact with the upper surface of the intermediate insulating layer 420. However, the disclosure is not limited thereto. In an alternative embodiment, the intermediate insulating layer 420 and the end of the second metal bank layer 320 arranged to be in contact with the upper surface of the intermediate insulating layer 420 may not be located on the same line as the end of the intermediate insulating layer 420. In such an embodiment, an end of the intermediate insulating layer 420 may protrude toward a center of the first opening 310OP of the first metal bank layer 310 than the end of the second metal bank layer 320. In In such an embodiment, the width of the opening 420OP of the intermediate insulating layer 420 may be less than the width of the opening 320OP of the second metal bank layer 320.

In an embodiment, an intermediate layer 410 may be located between the first metal bank layer 310 and the intermediate insulating layer 420. The intermediate layer 410 may be provided with an opening defined therethrough to overlap the first opening 310OP of the first metal bank layer 310. The intermediate layer 410 may include at least one selected from ITO, IZO, IGZO, ITZO, ZnO, AZO, GZO, ZTO, GTO, and FTO. In an embodiment where the intermediate insulating layer 420 including an inorganic insulating material is deposited on the first metal bank layer 310, arcing may occur in the intermediate insulating layer 420 due to a plasma or the like during the manufacturing process. In such an embodiment, when the intermediate insulating layer 420 including an inorganic insulating material is deposited on the first metal bank layer 310 by a chemical vapor deposition (CVD) process, defects may occur in the intermediate insulating layer 420 during the manufacturing process. After the intermediate layer 410 including a conductive oxide is disposed on the first metal bank layer 310, the intermediate insulating layer 420 may be formed by a CVD process. The intermediate layer 410 including the conductive oxide may assist the intermediate insulating layer 420 to be formed on the first metal bank layer 310.

The intermediate insulating layer 420 and the second metal bank layer 320 may form an overhang structure. The second metal bank layer 320 may be arranged to be in contact with the upper surface of the intermediate insulating layer 420. The second metal bank layer 320 may include or define a tip 320*a* protruding toward the center of the first opening 310OP of the first metal bank layer 310 from a point at which a side surface of the intermediate layer 410 disposed under the second metal bank layer 320 is in contact with a bottom surface of the intermediate insulating layer 420. The intermediate insulating layer 420 may be arranged to be in contact with an upper surface of the intermediate layer 410. The intermediate insulating layer 420 may include or define a tip 420*a* protruding toward the center of the first opening 310OP of the first metal bank layer 310 from a point at which a side surface of the intermediate layer 410 arranged to be in contact with the bottom surface of the intermediate insulating layer 420 is in contact with the bottom surface of the intermediate insulating layer 420.

Because structures of a dummy emission layer, a dummy opposite electrode, and a first inorganic encapsulation layer 510 vary between FIGS. 5A and 5B, depending on the embodiments, hereinafter, FIGS. 5A and 5B are separately described.

Referring to FIG. 5A, in an embodiment, the emission layer 220 may be formed through a deposition process. In an embodiment where the intermediate insulating layer 420 and the second metal bank layer 320 form an overhang structure, materials for forming the emission layer 220 may be deposited on the sub-pixel electrode 210, as shown in FIG. 5A, or may also be deposited on the upper surface of the second metal bank layer 320. The material deposited on the sub-pixel electrode 210 may correspond to the emission layer 220, and the material deposited on the upper surface of the second metal bank layer 320 may correspond to a dummy emission layer. In such an embodiment, a dummy emission layer and a dummy opposite electrode respectively separated or disconnected from the emission layer 220 and the opposite electrode 230 may be disposed on the upper surface of the second metal bank layer 320. However, one or more embodiments are not limited thereto.

Similar to the emission layer 220, the opposite electrode 230 may also be formed through deposition, and as shown in FIG. 5A, a dummy opposite electrode may be disposed on the upper surface of the second metal bank layer 320. The dummy opposite electrode may be disposed on the dummy emission layer. However, one or more embodiments are not limited thereto.

In an embodiment, the first inorganic encapsulation layer 510 may be disposed on the opposite electrode 230. The first inorganic encapsulation layer 510 may overlap and cover the light-emitting diode ED. The first inorganic encapsulation layer 510 may include at least one inorganic insulating material selected from aluminum oxide, titanium oxide, tantalum oxide, hafnium oxide, zinc oxide, silicon oxide, silicon nitride, and silicon oxynitride, and may be deposited through a CVD or the like.

The first inorganic encapsulation layer 510 has a relatively better or greater step coverage than the emission layer and the opposite electrode, and may not be separated or disconnected by the overhang structure of the second metal bank layer 320 and the intermediate insulating layer 420. The first inorganic encapsulation layer 510 may continuously extend to overlap upper and side surfaces of the dummy emission layer and the dummy opposite electrode, the first metal bank layer 310, the intermediate insulating layer 420, and the side surface of the second metal bank layer 320, and the upper surface of the opposite electrode 230. In an embodiment, for example, the first inorganic encapsulation layer 510 may continuously extend to overlap the upper and side surfaces of the dummy emission layer and the dummy opposite electrode, the intermediate layer 410, the intermediate insulating layer 420, and the side surface of the second metal bank layer 320, and the upper surface of the opposite electrode 230. The first inorganic encapsulation layer 510 may include a first portion 510*a* overlapping at least a portion of the first opening 310OP of the first metal bank layer 310, a second portion 510*b* overlapping the upper and side surfaces of the dummy emission layer and the dummy opposite electrode disposed on the second metal bank layer 320, and side surfaces of tips 320*a* and 420*a* of the second metal bank layer 320 and the intermediate insulating layer 420, and a third portion 510*c* overlapping a lower portion of a tip 420*b* of the intermediate insulating layer 420. Due to the first portion 510*a* of the first inorganic encapsulation layer 510 disposed at the upper portions of the dummy emission layer and the dummy opposite electrode, moisture may be effectively prevented from permeating through a lower portion of the dummy emission layer and damaging the emission layer.

Although not shown, an organic encapsulation layer may be disposed on the first inorganic encapsulation layer 510, and a second inorganic encapsulation layer may be disposed on the organic encapsulation layer. Similar to the first inorganic encapsulation layer, the second inorganic encapsulation layer may include at least one inorganic material selected from aluminum oxide, titanium oxide, tantalum oxide, hafnium oxide, zinc oxide, silicon oxide, silicon nitride, and silicon oxynitride, and may be deposited through a CVD method or the like. The second inorganic encapsulation layer may have a single-layer or multi-layer structure including at least one selected from the materials described above. The organic encapsulation layer may include a polymer-based material. Polymer-based materials may include acrylic-based resins, epoxy resins, polyimide, and polyethylene. In an embodiment, the organic encapsulation layer 520 may include acrylate.

Referring to FIG. 5B, in an alternative embodiment, the emission layer 220 may be disposed only on the sub-pixel electrode 210 and the dummy emission layer may not be disposed on the upper surface of the second metal bank layer 320. Although a material for forming an emission layer may be deposited on the upper surfaces of the sub-pixel electrode 210 and the second metal bank layer 320, in a process of forming the first inorganic encapsulation layer 510 later, a material for forming an emission layer disposed on the upper surface of the second metal bank layer 320 may be etched together with a material 510*s* for forming the first inorganic encapsulation layer, so that the material for forming the emission layer may be disposed only on the sub-pixel electrode 210. In such an embodiment, the emission layer 220 may be disposed only within the first opening 310OP of the first metal bank layer 310.

The emission layer 220 and the opposite electrode 230 may be disposed only on the sub-pixel electrode 210, and the dummy emission layer and the dummy opposite electrode may not be disposed on the upper surface of the second metal bank layer 320. Similar to the emission layer 220, in the opposite electrode 230, a material for forming an opposite electrode 210 may be deposited on the sub-pixel electrode 210 and the second metal bank layer 320, but in a process of forming the first inorganic encapsulation layer 510 later, the material for forming the opposite electrode disposed on the second metal bank layer 320 may be etched together with the material 510*s* for forming the first inorganic encapsulation layer, so that the material for forming the opposite electrode may be disposed only on the sub-pixel electrode. In such an embodiment, the emission layer 220 and the opposite electrode 230 may be disposed only within the first opening 310OP of the first metal bank layer 310.

The first inorganic encapsulation layer 510 may be disposed only in the first opening 510OP. The first inorganic encapsulation layer 510 may not be disposed on the upper surface of the second metal bank layer 320. The intermediate insulating layer 420 and the intermediate layer 410 are disposed to prevent permeation of moisture or oxygen from the upper surface of the second metal bank layer 320 to the emission layer 220 disposed on the sub-pixel electrode 210. Therefore, the first inorganic encapsulation layer 510 may not have the first portion 510*a* disposed on the upper surface of the second metal bank layer 320 as shown in FIG. 5A. However, one or more embodiments are not limited thereto.

In an embodiment where the intermediate layer 410 or the intermediate insulating layer 420 is not located between the first metal bank layer 310 and the second metal bank layer 320, in a process of forming the first inorganic encapsulation layer 510 after disposing the material 510*s* for forming the first inorganic encapsulation layer on the second metal bank layer 320 and performing etching, the emission layer 220 disposed on the sub-pixel electrode 210 due to permeation of oxygen or moisture caused by a gap between the first inorganic encapsulation layer 510 and the second metal bank layer, and thus, the luminance of the display device may change. In addition, when an external force or stress occurs after the first inorganic encapsulation layer 510 is formed, the tip 320*a* of the second metal bank layer 320 is deformed, and a floating may occur between a lower portion of the tip 320*a* of the second metal bank layer 320 and the first inorganic encapsulation layer 510.

In an embodiment, the intermediate layer 410 or the intermediate insulating layer may be located between the first metal bank layer 310 and the second metal bank layer 320. A thickness of the intermediate layer 410 or the intermediate insulating layer 4209 is ensured between the first metal bank layer 310 and the second metal bank layer 320, so that the first inorganic encapsulation layer 510 may be arranged at lower portions of the tips 320*a* and 420*a* of the second metal bank layer 320 and the intermediate insulating layer 420. In such an embodiment, the first inorganic encapsulation layer 510 may effectively encapsulate the side surfaces and lower portions of the tips 320*a* and 420*a* of the second metal bank layer 320 and the intermediate insulating layer 420.

In an embodiment where the intermediate insulating layer 420 is not arranged on a lower surface of the second metal bank layer 320, due to foreign substances present on a lower surface of the tip 320*a* of the second bank layer 320 during the manufacturing process, adhesion between the bottom surface of the tip 320*a* of the second metal bank layer 320 and the material 510*s* for forming the first inorganic encapsulation layer is reduced. As described above, in an embodiment, the second metal bank layer 320 and the intermediate insulating layer 420 may respectively include the tips 320*a* and 420*a* protruding toward the center of the first opening 310OP1 of the first metal bank layer 310 from the point at which the side surface of the intermediate layer 410 is in contact with the bottom surface of the intermediate insulating layer 420. In such an embodiment, the intermediate insulating layer 420 may be disposed on a bottom surface of the second metal bank layer 320, and the tip 420*a* of the intermediate insulating layer 420 may also be arranged in contact with the bottom surface of the tip 320*a* of the second metal bank layer 320. Because the tip 420*a* of the intermediate insulating layer 420 exists in contact with the bottom surface of the tip 320*a* of the second metal bank layer 320, foreign substances may not be present on the lower surface of the tip 320*a* of the second metal bank layer 320, and adhesion between the intermediate insulating layer 420 and the material 510*s* for forming the first inorganic encapsulation layer may be improved.

A contact force between the intermediate insulating layer 420 and the first inorganic encapsulation layer 510 may be greater than an adhesive force between the second metal bank layer 320 and the first inorganic encapsulation layer 510. The tip 420*a* of the intermediate insulating layer 420 including an inorganic insulating material is disposed on the bottom surface of the tip 320*a* of the second metal bank layer 320, and the lower surface of the tip 420*a* of the intermediate insulating layer 420 and the material 510*s* for forming the first inorganic encapsulation layer may be efficiently bonded to each other. The first inorganic encapsulation layer 510 may be disposed under the tips 320*a* and 420*a* of the second metal bank layer 320 and the intermediate insulating layer 420 without empty spaces. In such an embodiment, the first inorganic encapsulation layer 510 may include not only the first portion 510*a* overlapping at least a portion of the first opening 310OP1 of the first metal bank layer 310, and a second portion 510*b* overlapping the upper portions and side surfaces of the dummy emission layer and the dummy opposite electrode disposed on the second metal bank layer 320 and the side surfaces of the tips 320*a* and 420*a* of the intermediate insulating layer 420, but also the third portion 510*c* overlapping the lower portions of the tips 320*a* and 420*a* of the second metal bank layer 320 and the intermediate insulating layer 420. The tip 420*a* of the intermediate insulating layer 420 including an inorganic insulating material is disposed on the bottom surface of the tip 320*a* of the second metal bank layer 320, and even when an empty space is formed under the second metal bank layer 320, in the first inorganic encapsulation layer 510, the tip 420*a* of the intermediate insulating layer 420 disposed on the bottom surface of the tip 320*a* of the second metal bank layer 320 may compensate for the empty space.

In an embodiment, the intermediate layer 410 or the intermediate insulating layer 420 is located between the first metal bank layer 310 and the second metal bank layer 320, and the tip 420*a* of the intermediate insulating layer 420 including an inorganic insulating material is disposed on the bottom surface of the tip 320*a* of the second metal bank layer, so that the first inorganic encapsulation layer 510 may be disposed under the tips 320*a* and 420*a* of the second metal bank layer 320 and the intermediate insulating layer 420 without an empty space, thereby preventing moisture or oxygen from permeating from the upper surface of the second metal bank layer 320 to the emission layer 220 disposed on the sub-pixel electrode 210. Due to the formation of the intermediate layer 410 and the intermediate insulating layer 420, it is possible to effectively prevent moisture and oxygen from permeating into the emission layer 220, and thus, a process of forming a protective layer on the first inorganic encapsulation layer, according to the related art may be omitted, and the first portion 510*a* of the first inorganic encapsulation layer 510 shown in FIG. 5A may not be formed as shown in FIG. 5B. In addition, in the process of forming the first inorganic encapsulation layer 510, a process of wet etching as well as dry etching may be used. Permeation of moisture and oxygen into the emission layer 220 may be prevented, and staining or pixel shrinkage may be prevented.

FIGS. 6 to 14B schematically illustrate cross-sectional views of a display device showing a method of manufacturing a display device, according to one or more embodiments. Specifically, FIGS. 6 to 13 and 14A schematically illustrate cross-sectional views showing a manufacturing process of a display device, according to an embodiment of FIG. 5A, and FIGS. 6 to 13 and 14B schematically illustrate cross-sectional views showing a manufacturing process of a display device, according to an embodiment of FIG. 5B.

Referring to FIGS. 6 to 14B, an embodiment of a method of manufacturing a display device may include: forming the sub-pixel electrode 210 on the substrate 100; forming the protective layer 113 on at least a portion of the sub-pixel electrode 210; forming, on the sub-pixel electrode 210, the insulating layer 115 with an opening formed therethrough to overlap the sub-pixel electrode 210; forming, on the insulating layer 115, the first metal bank layer 310 with the first opening 310OP1 formed therethrough to overlap the sub-pixel electrode 210; forming, on the first metal bank layer 310, the intermediate layer 410 with an opening formed therethrough to overlap the first opening 310OP1 of the first metal bank layer 310; forming, on the intermediate layer 410, the intermediate insulating layer 420 with the opening 420OP formed therethrough to overlap at least a portion of the first opening 310OP1 of the first metal bank layer 310; forming, on the intermediate insulating layer 420, the second metal bank layer 320 with the opening 320OP formed therethrough to overlap at least a portion of the first opening 310OP1 of the first metal bank layer 310; forming the emission layer 220 on the sub-pixel electrode 210 in the first opening 310OP1 of the first metal bank layer 310; forming the opposite electrode 230 on the emission layer 220 in the first opening 310OP1 of the first metal bank layer 310; and forming the first inorganic encapsulation layer 510 on the opposite electrode 230.

Figure 6:
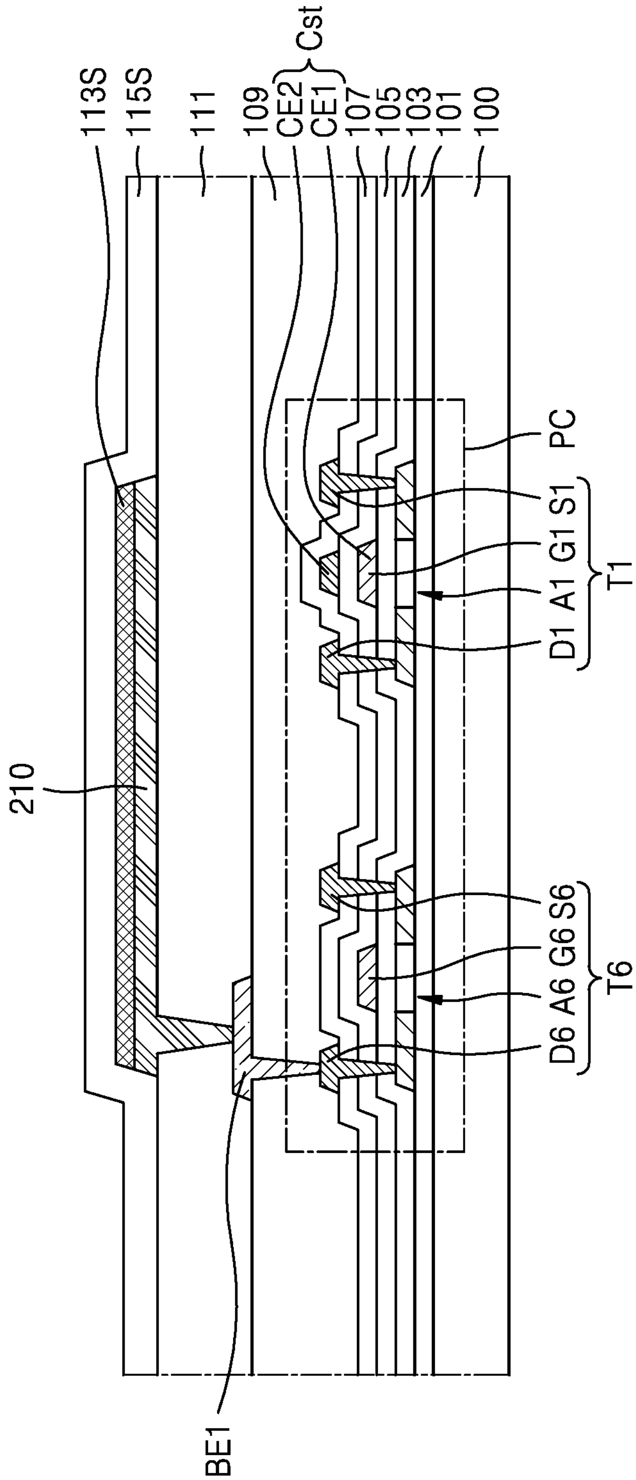
FIGS. 6 to 14B schematically illustrate cross-sectional views of a display device showing a method of manufacturing a display device, according to an embodiment.

Referring to FIG. 6, a sub-pixel circuit PC may be formed on the substrate 100. The sub-pixel circuit PC including a first transistor T1, a sixth transistor T6, and a storage capacitor Cst may be formed on the substrate 100.

A first organic insulating layer 109 may be disposed on the substrate 100 to cover the sub-pixel circuit PC. The first organic insulating layer 109 may include an organic insulating material, such as acrylic, BCB, polyimide, or HMDSO. A connection electrode BE1 may be disposed on the first organic insulating layer 109. The connection electrode BE1 may be connected to a sixth drain electrode D6 or a sixth source electrode S6 through a contact hole defined in the first organic insulating layer 109.

A second organic insulating layer 111 may be disposed on the first organic insulating layer 109. The second organic insulating material 111 may be arranged between the connection electrode BE1 and a sub-pixel electrode 210. The second organic insulating material 111 may include an organic insulating material, such as acrylic, BCB, polyimide, or HMDSO.

The sub-pixel electrode 210 may be disposed on the second organic insulating layer 111. The sub-pixel electrode 210 may include metal and/or conductive oxide. The sub-pixel electrode 210 may include a reflective film including Ag, Mg, Al, Pt, Pd, Au, Ni, Nd, Ir, Cr, or a compound thereof, and a film including ITO, IZO, ZnO, or $In_2O_3$.

A material 113*s* for forming a protective layer may be provided on the sub-pixel electrode 210. The material 113*s* for forming the protective layer may be provided only on an upper surface of the sub-pixel electrode 210. The material 113*s* for forming the protective layer may include a conductive oxide, such as ITO, IZO, IGZO, ITZO, ZnO, AZO, GZO, ZTO, GTO, and FTO.

A material for forming an insulating layer may be provided on the material 113*s* for forming the protective layer. The material 115*s* for forming the insulating layer may be continuously formed on the substrate 100. The material 115*s* for forming the insulating layer may include an inorganic insulating material, such as silicon oxide, silicon nitride, and silicon oxynitride, and may have a single-layer or multi-layer structure including at least one selected from the inorganic insulating materials described above.

Figure 7:
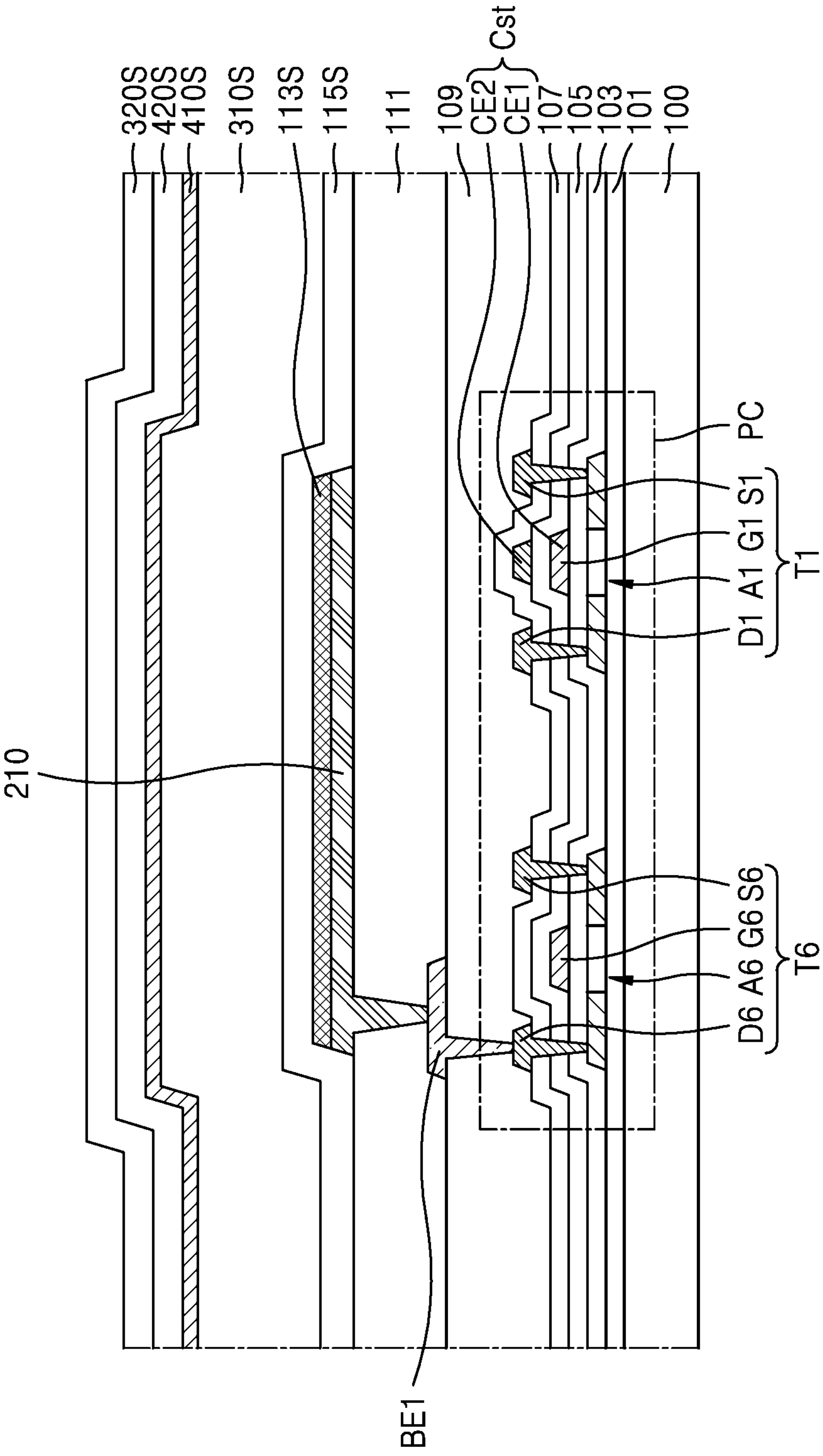

Referring to FIG. 7, a material 310*s* for forming a first metal bank layer may be provided on the material 115*s* for forming the insulating layer. The material 310*s* for forming the first metal bank layer may include Al. A material 410*s* for forming an intermediate layer may be provided on the material 310*s* for forming the first metal bank layer. The material 410*s* for forming the intermediate layer may include at least one of ITO, IZO, IGZO, ITZO, ZnO, AZO, GZO, ZTO, GTO, and FTO. A material 420*s* for forming an intermediate insulating layer may be provided on the material 410*s* for forming the intermediate layer. The material 420*s* for forming the intermediate insulating layer may include at least one selected from silicon oxide or silicon nitride. A material 320*s* for forming a second metal bank layer may be provided on the material 420*s* for forming the intermediate insulating layer. The material 320*s* for forming the second metal bank layer may include Ti. However, one or more embodiments are not limited thereto.

Figure 8:
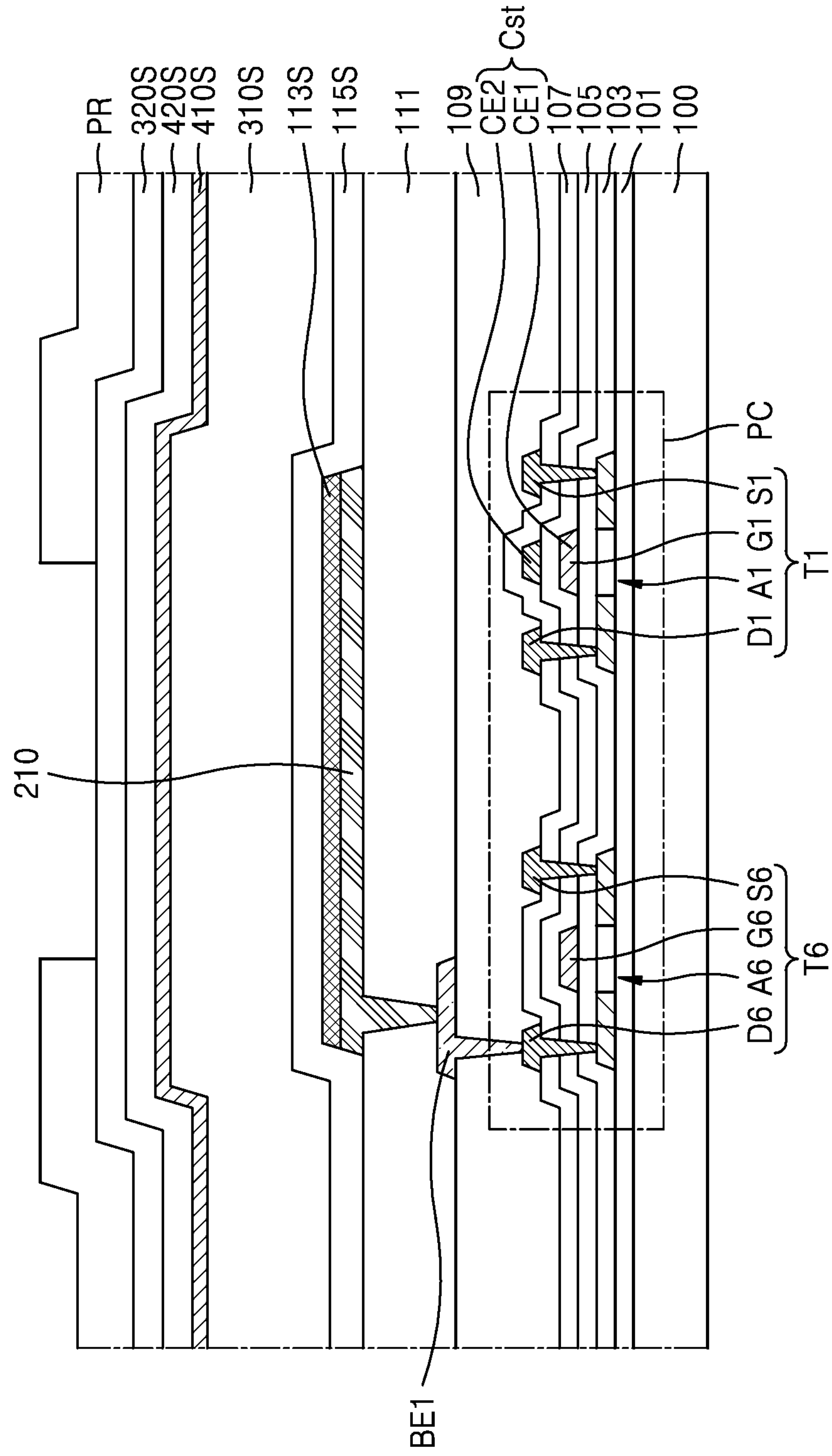

Referring to FIG. 8, a photoresist PR may be provided on at least a portion of the material 320*s* for forming the second metal bank layer. The photoresist PR may be provided with an opening 420OP overlapping the opening 320OP (see FIG. 5A) of the second metal bank layer 320 (see FIG. 5A) and the opening 430OP (see FIG. 5A) of the intermediate insulating layer 420 (see FIG. 5A). At least a portion of an upper surface of the material 320*s* for forming the second metal bank layer may be exposed through the opening of the photoresist PR.

Figure 9:
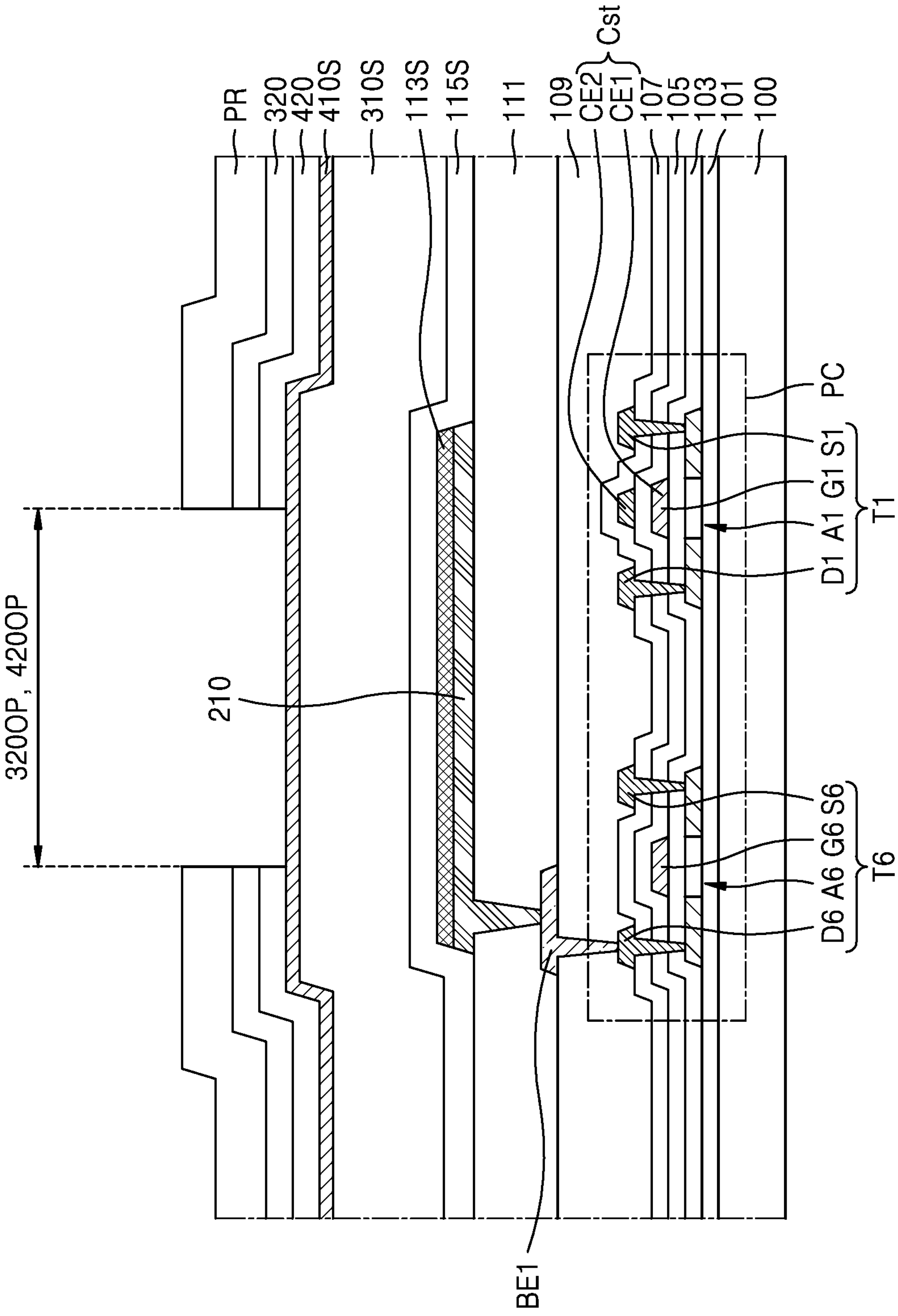

Referring to FIG. 9, a portion of the material 320*s* for forming the second metal bank layer and a portion of the material 420*s* for forming the intermediate insulating layer may be removed by using the photoresist PR as a mask. In an embodiment, for example, a portion of the material 320*s* for forming the second metal bank layer and a portion of the material 420*s* for forming the intermediate insulating layer may be sequentially removed through the opening of the photoresist PR. The portion of the material 320*s* for forming the second metal bank layer and the portion of the material 420*s* for forming the intermediate insulating layer may be removed by dry etching. A portion of the material 320*s* for forming the second metal bank layer may be removed to form the second metal bank layer 320. A portion of the material 420*s* for forming the intermediate insulating layer may be removed to form the intermediate insulating layer 420. During the etching process, the material 115*s* for forming the insulating layer and the material 113*s* for forming the protective layer may protect the sub-pixel electrode 210 thereunder.

By the etching process, the opening 320OP overlapping the sub-pixel electrode 210 and the material 113*s* for forming the protective layer may be formed in the material 320*s* for forming the second metal bank layer to extend to the bottom surface from the upper surface thereof. As the opening 320OP is formed in the material 320*s* for forming the second metal bank layer by dry etching, the second metal bank layer 320 may be formed. The opening 420OP overlapping the sub-pixel electrode 210 and the material 113*s* for forming the protective layer may also be formed in the material 420*s* for forming the intermediate insulating layer to extend to the bottom surface from the upper surface thereof. As the opening 420OP is formed in the material 420*s* for forming the intermediate insulating layer by dry etching, the intermediate insulating layer 420 may be formed.

As at least a portion of the material 320*s* for forming the second metal bank layer and the material 420*s* for forming the intermediate insulating layer is removed through a dry etching process to form the second metal bank layer 320 and the intermediate insulating layer 420, respectively, at least a portion of the upper surface of the material 410*s* for forming the intermediate layer may be exposed. In such an embodiment, due to the opening 320OP of the second metal bank layer 320 and the opening 420OP of the intermediate insulating layer OP, which are formed by the etching process, at least a portion of the upper surface of the material 410*s* for forming the intermediate layer may be exposed.

Figure 10:
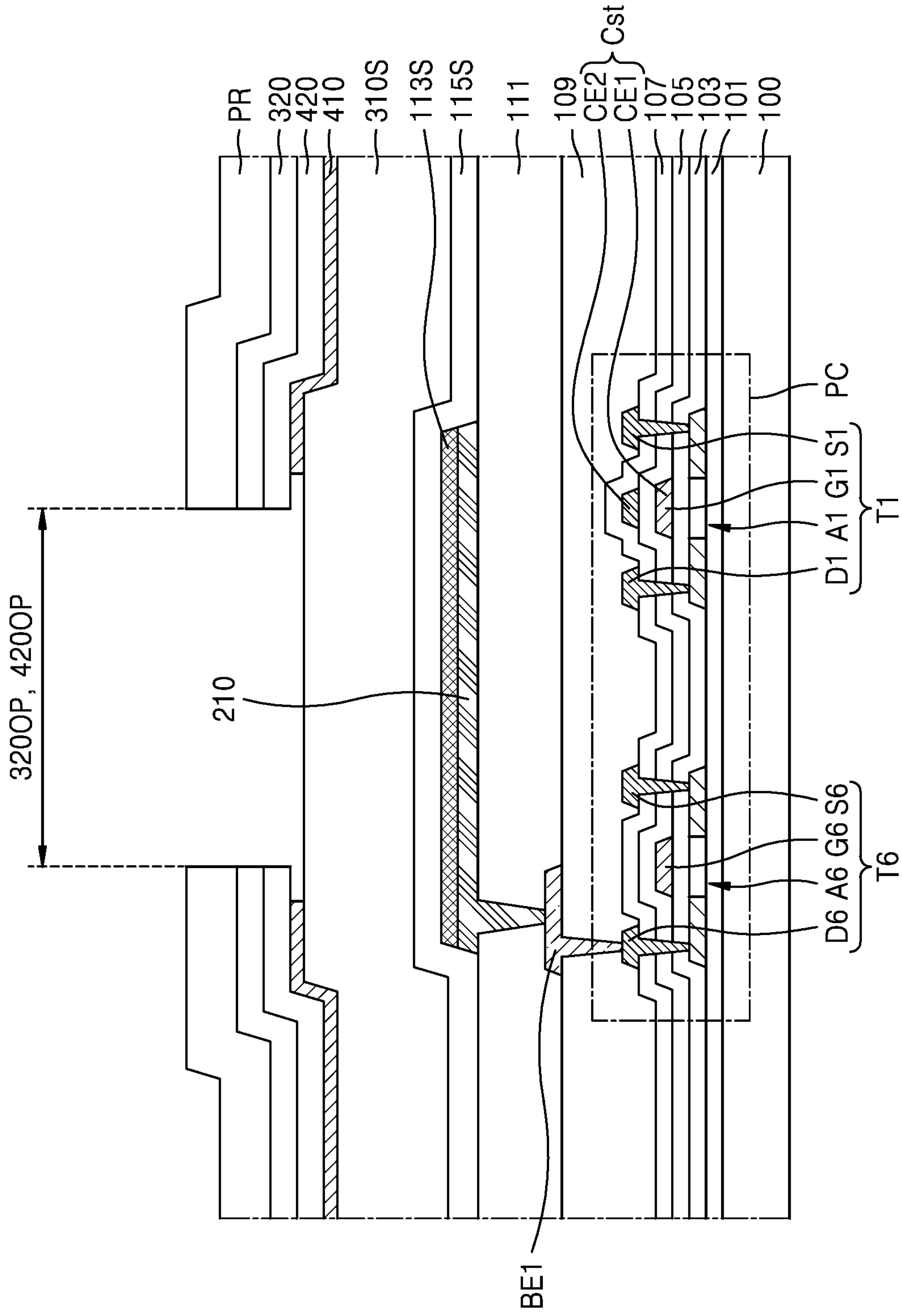

Referring to FIG. 10, at least a portion of the material 410*s* for forming the intermediate layer may be removed by using the photoresist PR as a mask. In an embodiment, for example, a portion of the material 410*s* for forming the intermediate layer may be removed through the opening of the photoresist PR. The material 410*s* for forming the intermediate layer may be removed by wet etching. Because the material 410*s* for forming the intermediate layer is removed by a wet etching process, an end of the intermediate layer 410 may be formed to be arranged inward than an end of the photoresist PR due to the nature of the process. Due to the nature of the wet etching process, a larger portion of the material 410*s* for forming the intermediate layer may be removed than the material 420*s* for forming the intermediate insulating layer and the material 320*s* for forming the second metal bank layer.

Figure 11:
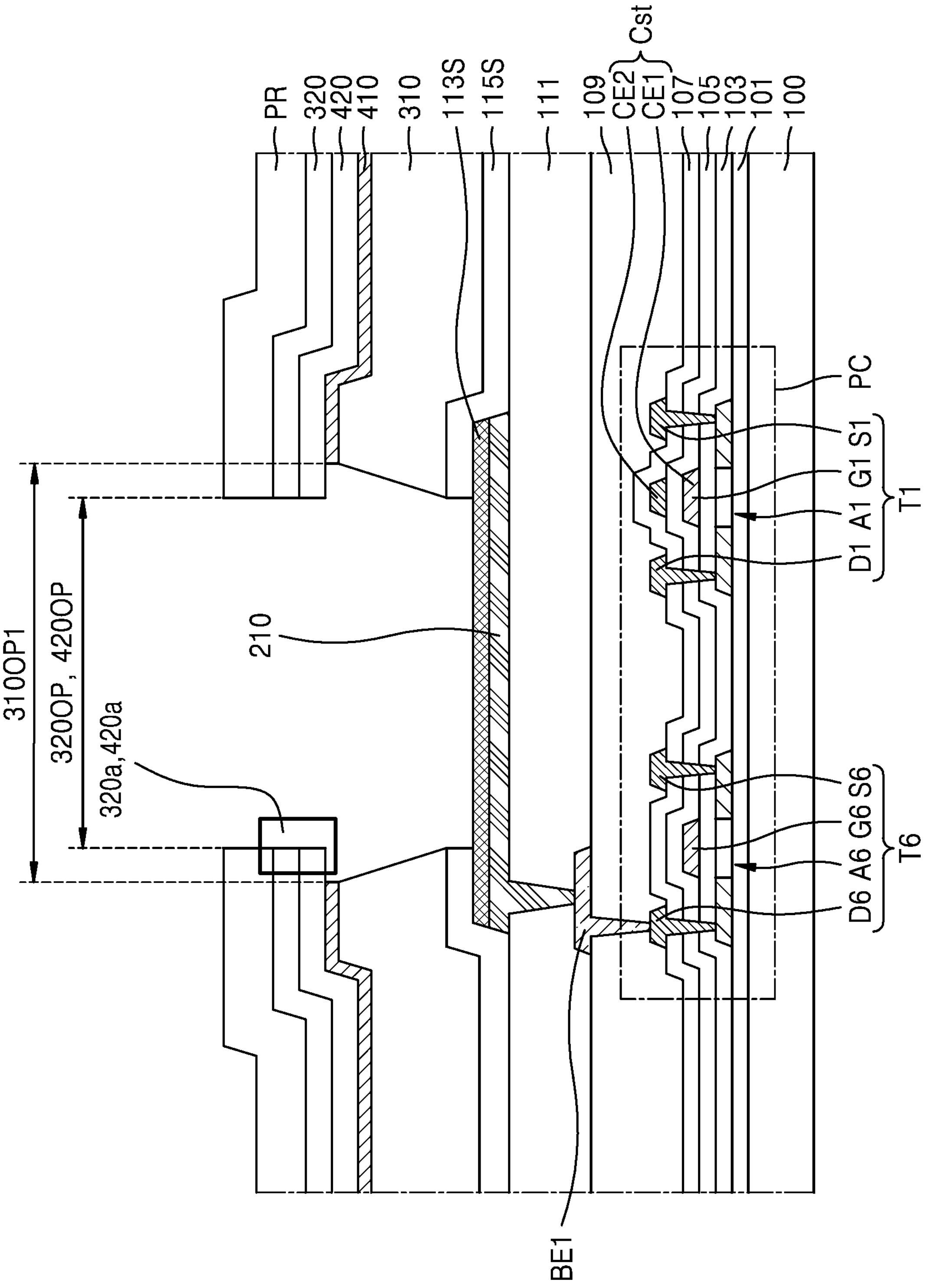

Referring to FIG. 11, an undercut-shaped first opening 310OP1 in the material 310*s* for forming the first metal bank layer and an opening in the material 115*s* for forming the insulating layer may be formed by using the photoresist PR as a mask.

Before the undercut-shaped first opening 310OP1 is formed in the material 310*s* for forming the first metal bank layer, a portion of the material 310*s* for forming the first metal bank layer and the material 115*s* for forming the insulating layer may be removed by using the photoresist PR as a mask. In an embodiment, for example, a portion of the material 310*s* for forming the first metal bank layer and a portion of the material 115*s* for forming the insulating layer may be sequentially removed through an opening of the photoresist PR. A portion of the material 310*s* for forming the first metal bank layer and a portion of the material 115*s* for forming the insulating layer may be removed by dry etching. A portion of the material 115*s* for forming the insulating layer may be removed by dry etching to form the insulating layer 115. A portion of the material 310*s* for forming the first metal bank layer may be removed by dry etching and subsequent wet etching to form the first metal bank layer 310. During the etching process, the material 115*s* for forming the insulating layer and the material 113*s* for forming the protective layer may protect the sub-pixel electrode 210 thereunder.

By the dry etching process, an opening overlapping the sub-pixel electrode 210 and the material 113*s* for forming the protective layer and passing through the bottom surface from the upper surface of the material 310*s* for forming the metal bank layer may be formed in the material 310*s* for forming the metal bank layer. An opening overlapping the sub-pixel electrode 210 and the material 113*s* for forming the protective layer may also be formed in the material 115*s* for forming the insulating layer to the bottom surface thereof from the upper surface thereof. The insulating layer 115 may be formed by removing a portion of the material 115*s* for forming the insulating layer to define an opening in the material 115*s* for forming the insulating layer. After dry etching, each of a width of the opening of the material 310*s* for forming the first metal bank layer and a width of the opening of the material 115*s* for forming the insulating layer may be equal to a width of the opening of the photoresist PR. In such an embodiment, the width of the opening of the material 310*s* for forming the first metal bank layer and the width of the opening of the insulating layer 115 may be equal to the width of the opening 320OP of the second metal bank layer 320 and the width of the opening 420OP of the intermediate insulating layer 420, respectively.

At least a portion of the material 310*s* for forming the first metal bank layer and the material 115*s* for forming the insulating layer may be removed through a dry etching process, so that at least a portion of the upper surface of the material 113*s* for forming the protective layer may be exposed. In such an embodiment, due to the opening of the first metal bank layer 310 and the opening of the insulating layer 115, which are defined by the etching process, at least a portion of the upper surface of the material 113*s* for forming the protective layer may be exposed.

In an embodiment, a portion of the material 310*s* for forming the first metal bank layer may be further etched by using the photoresist PR as a mask to form the first opening 310OP1 having an undercut structure in the material 310*s* for forming the first metal bank layer. After etching, the width of the first opening 310OP1 of the first metal bank layer 310 may be greater than each of the width 320OP of the second metal bank layer 320 and the opening 420OP of the intermediate insulating layer 420. In an embodiment, the first opening 310OP1 of the first metal bank layer 310 may have a shape in which a width decreases toward the bottom. In an embodiment, for example, a width of the upper portion of the first opening 310OP1 of the first metal bank layer 310 may be greater than a width of a lower portion. In such an embodiment, a side surface of the first opening 310OP1 of the first metal bank layer 310 may include a forward tapered inclined surface.

In an embodiment, the first opening 310OP1 having the shape of an undercut structure of the first metal bank layer 310 may be formed through wet etching. The first opening 310OP1 of the first metal bank layer 310 may be formed through wet etching. Because the first metal bank layer 310 and the second metal bank layer include metals having different etching selectivities from each other, a portion of the material 310*s* for forming the first metal bank layer may be further removed in the wet etching process, and the opening 310OP1 of the first metal bank layer 310 including a width greater than that of the opening 320OP of the second metal bank layer 320 may be formed. A portion of the material 310*s* for forming the first metal bank layer may be further removed through wet etching, so that the first opening 310OP1 having an undercut shape is defined in the material 310*s* for forming the first metal bank layer, thereby forming the first metal bank layer 310. During the etching process for forming the first opening 310OP1 of the first metal bank layer 310, the insulating layer 115 and the material 113*s* for forming the protective layer may protect the sub-pixel electrode 210 thereunder. Because the first opening 310OP1 of the first metal bank layer 310 has a width greater than each of widths of the opening 320OP of the second metal bank layer 320 and the opening 420OP of the intermediate insulating layer 420, the second metal bank layer 320 and the intermediate insulating layer 420 may have tips 320*a* and 420*a*, respectively. In an embodiment, for example, the second metal bank layer 320 is in contact with the upper surface of the intermediate insulating layer 420 and may include the tip 320*a* protruding toward the center of the first opening 310OP1 of the first metal bank layer 310 from a point at which a side surface of the intermediate layer 410 is in contact with the bottom surface of the intermediate insulating layer 420. The intermediate insulating layer 420 is in contact with the upper surface of the intermediate layer 410 and may include the tip 420*a* protruding toward the center of the first opening 310OP1 of the first metal bank layer 310 from the point at which the side surface of the intermediate layer 410 is in contact with the bottom surface of the intermediate insulating layer 420.

Figure 12:
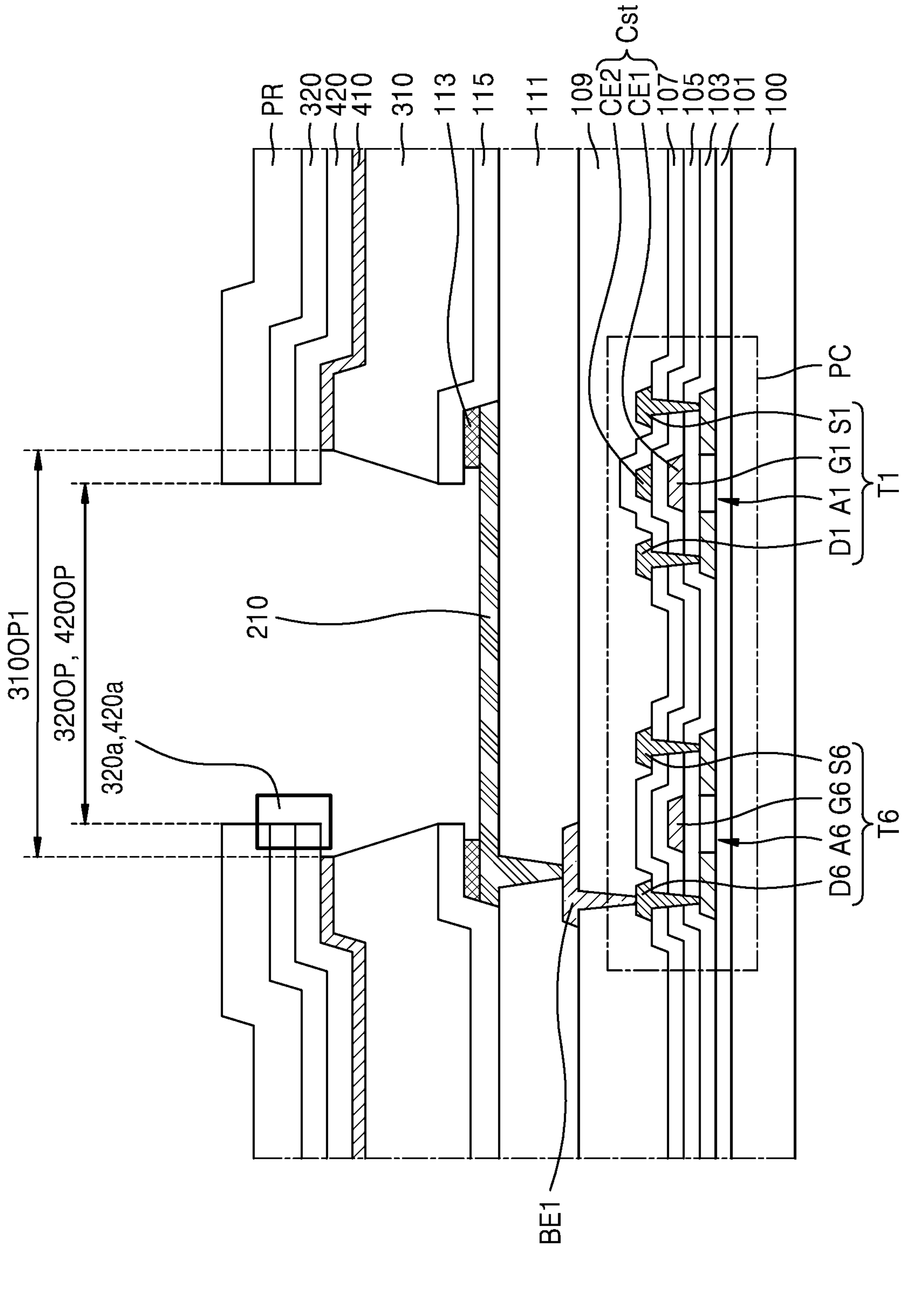

Referring to FIG. 12, a portion of the material 113*s* for forming the protective layer may be removed by using the photoresist PR as a mask. A portion of the material 113*s* for forming the protective layer may be removed by using wet etching. A portion of the material 113*s* for forming the protective layer is removed, so that an opening is defined in the material 113*s* for forming the protective layer, thereby forming the protective layer 113. At least a portion of the sub-pixel electrode 210 may be exposed through an opening of the protective layer 113. A width of an opening of the protective layer 113 formed by removing a portion of the material 113*s* for forming the protective layer may be greater than a width of the opening of the insulating layer 115. In such an embodiment, an edge (or side) of the protective layer 113 defining an opening of the protective layer 113 may be located under the insulating layer 115. Thereafter, the photoresist PR may be removed.

Figure 13:
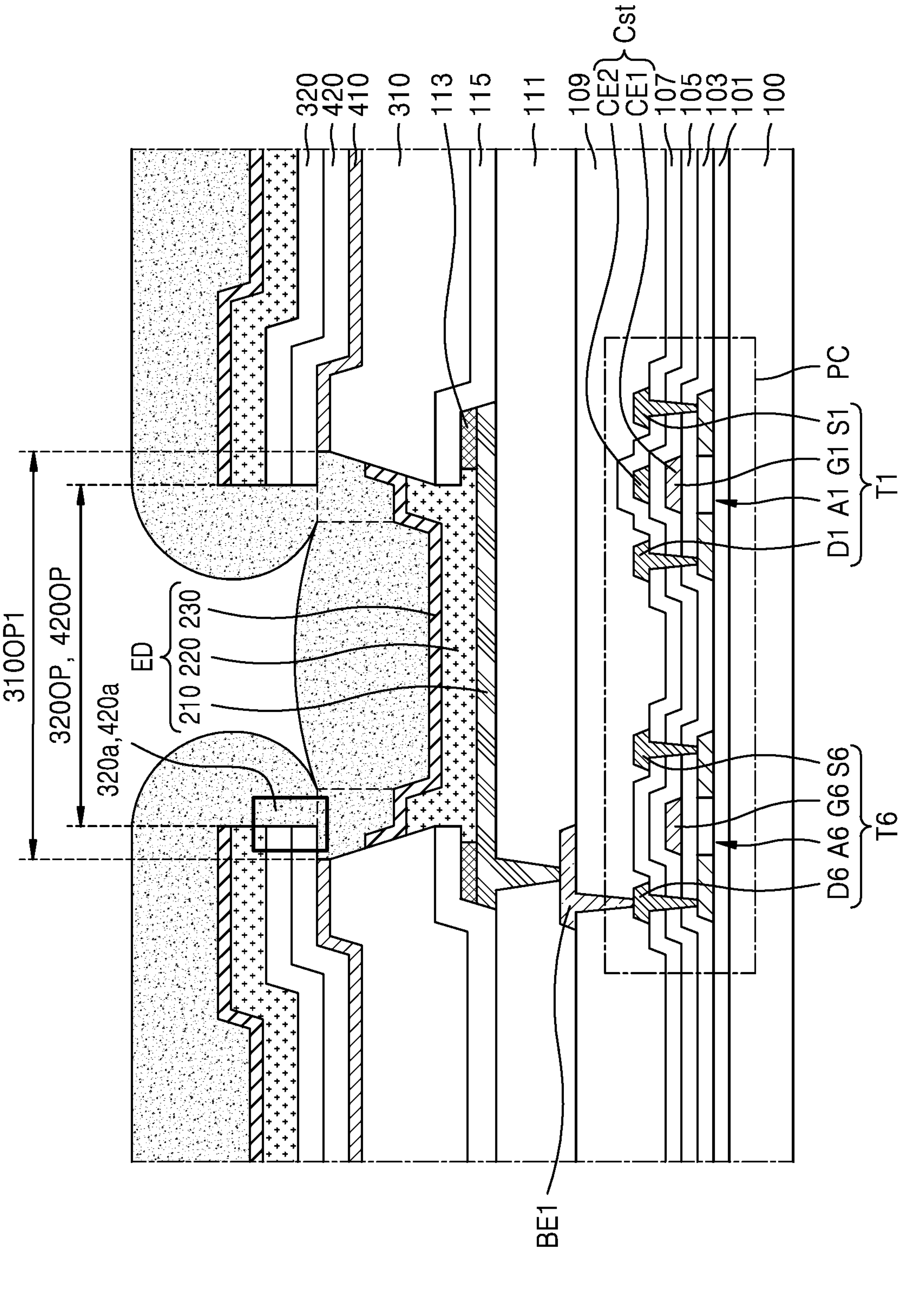

Referring to FIG. 13, after the photoresist PR is removed, the emission layer 220 and the opposite electrode 230 may be formed to overlap the sub-pixel electrode 210. A stack structure of the sub-pixel electrode, the emission layer 220, and the opposite electrode 230 may correspond to the light-emitting diode ED. As an embodiment, the emission layer 220 and the opposite electrode 230 may be formed through a deposition method, such as a thermal deposition method.

The emission layer 220 may overlap and be in contact with the sub-pixel electrode 210 through the first opening 310OP1 of the first metal bank layer 310, the opening of the insulating layer 115, and the opening of the protective layer 113. A width of an emission region of the light-emitting diode ED may be substantially equal to a width of the opening of the insulating layer 115.

Because the emission layer 220 and the opposite electrode 230 are deposited without a separate mask, the material for forming the emission layer and the material for forming the opposite electrode may also be continuously disposed on the second metal bank layer 320. However, at least a portion of the material for forming the emission layer and the material for forming the opposite electrode disposed on the second metal bank layer 320 may be removed during a patterning process of the material 510*s* for forming the first inorganic encapsulation layer disposed on at least a portion of the second metal bank layer 320.

The material 510*s* for forming the first inorganic encapsulation layer may be disposed on the light-emitting diode ED. The material 510*s* for forming the first inorganic encapsulation layer may include at least one inorganic material selected from aluminum oxide, titanium oxide, tantalum oxide, hafnium oxide, zinc oxide, silicon oxide, silicon nitride, and silicon oxynitride, and may be deposited through a method such as a CVD method. The material 510*s* for forming the first inorganic encapsulation layer may have a single-layer or multi-layer structure including at least one selected from the materials described above.

Figure 14A:
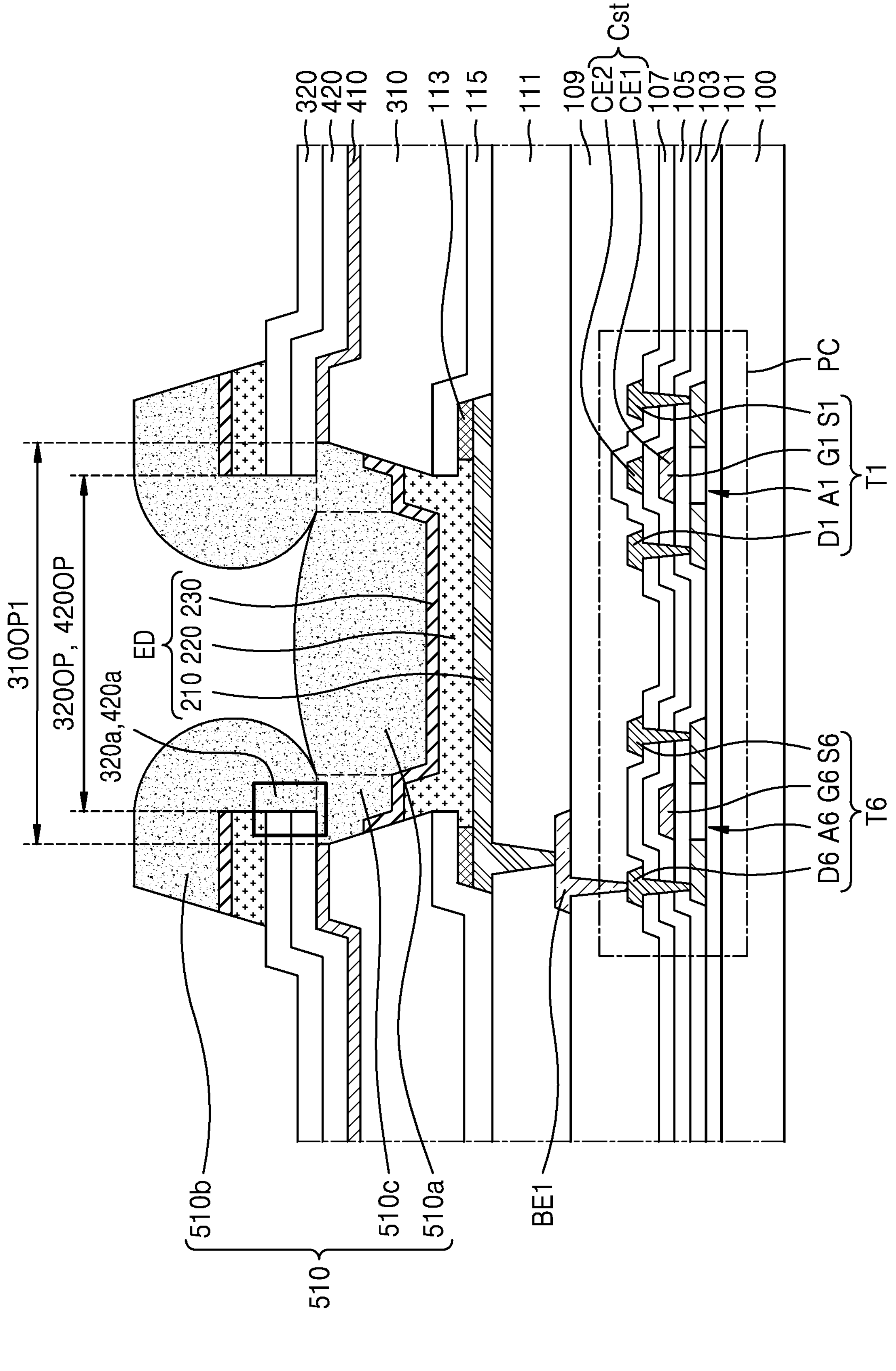

Referring to FIG. 14A, in an embodiment, although not shown, a mask layer may be formed on at least a portion of the material 510*s* for forming the first inorganic encapsulation layer. In the mask layer, the material for forming the emission layer disposed on the second metal bank layer 320, the material for forming the opposite electrode disposed on the second metal bank layer 320, and the material 510*s* for forming the first inorganic encapsulation layer disposed on the second metal bank layer 320 may be disposed on a portion to remain without being removed after the etching process. In such an embodiment, the mask layer may be arranged to overlap at least a portion of the opening 320OP of the second metal bank layer 320, the opening 420OP of the intermediate insulating layer 420, and the first opening 310OP1 of the first metal bank layer 310. The mask layer may include a conductive oxide, such as IGZO.

By using the mask layer as a mask, at least a portion of the material for forming the emission layer disposed on the second metal bank layer 320, the material for forming the opposite electrode disposed on the second metal bank layer

320, and the material 510*s* for forming the first inorganic encapsulation layer disposed on the second metal bank layer 320 may be removed through an etching process. In such an embodiment, the material for forming the emission layer disposed on the second metal bank layer 320, the material for forming the opposite electrode disposed on the second metal bank layer 320, and the material 510*s* for forming the first inorganic encapsulation layer disposed on the second metal bank layer 320, on which the mask layer is not disposed, may be removed through an etching process.

After the etching process, a dummy emission layer and a dummy opposite electrode may be formed on the second metal bank layer 320. The emission layer 220 and the dummy emission layer may be separated (or disconnected) and spaced apart from each other, and the opposite electrode 230 and the dummy opposite electrode may be separated and spaced apart from each other. The emission layer 220 and the dummy emission layer may include a same material and/or a same number of sub-layers (e.g., a first common layer and a second common layer) as each other. The opposite electrode 230 and the dummy opposite electrode may include a same material as each other.

After the etching process, the first inorganic encapsulation layer 510 may be formed to continuously extend to overlap upper portions and side surfaces of the dummy emission layer and the dummy opposite electrode disposed on the second metal bank layer 320, side surfaces of the first metal bank layer 310, the intermediate insulating layer 420, and the second metal bank layer 320, and the upper surface of the opposite electrode 230.

The first inorganic encapsulation layer 510 having a relatively excellent step coverage may cover a portion of an inner surface of the first opening 310OP1 of the first metal bank layer 310 having an undercut structure. In addition, because the intermediate insulating layer 420 is arranged to be in contact with the bottom surface of the second metal bank layer 320 to ensure a thickness, the first inorganic encapsulation layer 510 may be disposed on side surfaces and lower portions of the tips 320*a* and 420*a* of the second metal bank layer 320 and the intermediate insulating layer 420. An adhesive force between the first inorganic encapsulation layer 510 and the lower portion of the tip 420*a* of the intermediate insulating layer 420 including an inorganic insulating material may be greater than an adhesive force between the lower portion of the tip 320*a* of the second metal bank layer 320 and the first inorganic encapsulation layer 510. The tip 420*a* of the intermediate insulating layer 420 including the inorganic insulating material is arranged on a lower surface of the tip 320*a* of the second metal bank layer 320, so that the first inorganic encapsulation layer 510 may be arranged at the lower portions of the tips 320*a* and 420*a* of the second metal bank layer 320 and the intermediate insulating layer 420 without empty spaces. The first inorganic encapsulation layer 510 may not only include a first portion 510*a* overlapping at least a portion of the first opening 310OP1 of the first metal bank layer 310, and a second portion 510*b* overlapping upper portions and side surfaces of the dummy emission layer and the dummy opposite electrode disposed on the second metal bank layer 320 and the side surfaces of the tips 320*a* and 420*a* of the second metal bank layer 320 and the intermediate insulating layer 420, but also a third portion 510*c* overlapping the lower portions of the tips 320*a* and 420*a* of the second metal bank layer 320 and the intermediate insulating layer 420.

Figure 14B:
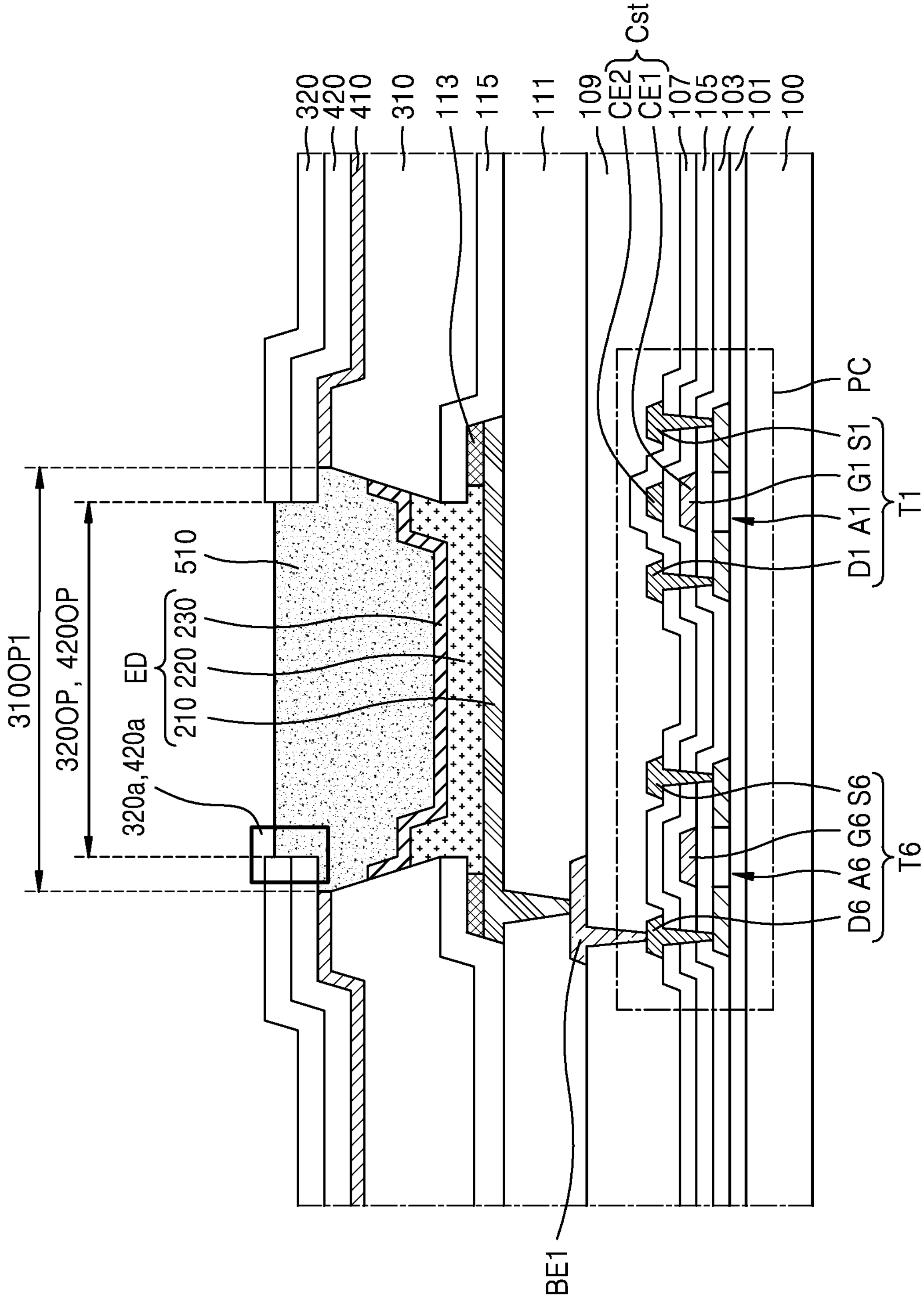

Referring to FIG. 14B, in an alternative embodiment, a mask layer may be formed on at least a portion of the material 510*s* for forming the first inorganic encapsulation layer. The mask layer may be disposed on the emission layer 220 arranged to overlap the sub-pixel electrode 210, the opposite electrode 230 arranged to overlap the sub-pixel electrode 210, and the material 510*s* for forming the first inorganic encapsulation layer arranged to overlap the sub-pixel electrode 210. In such an embodiment, the mask layer may be arranged to overlap the opening 320OP of the second metal bank layer 320 and the opening 420OP of the intermediate insulating layer 420. The mask layer may include a conductive oxide, such as IGZO.

By using the mask layer as a mask, the material for forming the emission layer disposed on the second metal bank layer 320, the material for forming the opposite electrode disposed on the second metal bank layer 320, and the material 510*s* for forming the first inorganic encapsulation layer disposed on the second metal bank layer 320 may be removed. As the material 510*s* for forming the first inorganic encapsulation layer disposed on the second metal bank layer 320 is removed, the first inorganic encapsulation layer 510 overlapping the opening 320OP of the second metal bank layer 320 and the opening 420OP of the intermediate insulating layer 420 may be formed. The first inorganic encapsulation layer 510 may be disposed only in the first opening 310OP1 of the first metal bank layer 310. The first inorganic encapsulation layer 510 may not be disposed on the second metal bank layer 320. In an embodiment, as shown in FIG. 14B, the dummy emission layer and the dummy opposite electrode disposed on the second metal bank layer 320 shown in FIG. 14A may not be formed.

In the related art or a conventional display device, the intermediate layer 410 and the intermediate insulating layer 420 are not located between the first metal bank layer 310 and the second metal bank layer 320, and thus, in a process of forming the first inorganic encapsulation layer 510 by disposing the material 510*s* for forming the first inorganic encapsulation layer on the second metal bank layer 320 and performing etching, a gap occurs between the first inorganic encapsulation layer 510 and the second metal bank layer 320, so that oxygen, moisture, or the like permeates, damaging the emission layer 220 disposed on the sub-pixel electrode 210 and changing a luminance of the display device. In addition, when an external force or stress occurs after the first inorganic encapsulation layer 510 is formed, the tip of the second metal bank layer 320 is deformed, and lifting may occur between the lower portion of the tip 320*a* of the second metal bank layer 320 and the first inorganic encapsulation layer 510.

In an embodiment, the intermediate layer 410 or the intermediate insulating layer 420 may be located between the first metal bank layer 310 and the second metal bank layer 320. In such an embodiment where the intermediate insulating layer 420 is arranged on the lower surface of the second metal bank layer 320, for example, where the tip 420*a* of the intermediate insulating layer 420 is arranged on the lower surface of the tip 320*a* of the second metal bank layer 320, a thickness is ensured between the first metal bank layer 310 and the second metal bank layer 320, so that the first inorganic encapsulation layer 510 may effectively encapsulate the side surfaces and lower portions of the tips 320*a* and 420*a* of the second metal bank layer 320 and the intermediate insulating layer 420. In such an embodiment, because the intermediate insulating layer 420 includes an inorganic material and an adhesive force between the first inorganic encapsulation layer 510 and the lower surface of the tip 420*a* of the intermediate insulating layer 420 is substantially great, the first inorganic encapsulation layer

510 may be disposed under the tip 420*a* of the intermediate insulating layer 420 without empty spaces.

In such an embodiment, as the first inorganic encapsulation layer 510 effectively encapsulate the side surfaces and lower portions of the tips 320*a* and 420*a* of the second metal bank layer 320 and the intermediate insulating layer 420 and is formed under the tip 420*a* of the intermediate insulating layer 420 without empty spaces, moisture or oxygen may be effectively prevented from permeating from the upper surface of the second metal bank layer 320 to the emission layer 220 disposed on the sub-pixel electrode 210.

In such an embodiment, because moisture and oxygen may be effectively prevented from permeating to the emission layer 220, a conventional process of forming a protective layer on the first inorganic encapsulation layer 510 may be omitted, and not only dry etching but also wet etching may be used in the process of forming the first inorganic encapsulation layer 510. In such an embodiment, because permeation of moisture and oxygen to the emission layer 220 is effectively prevented, staining or pixel shrinkage may be effectively prevented.

According to one or more embodiments configured as described above, a display device capable of preventing permeation of moisture and oxygen to an emission layer and a method of manufacturing the display device may be implemented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a substrate;

a sub-pixel electrode disposed on the substrate;

an insulating layer disposed on the sub-pixel electrode, wherein an opening is defined through the insulating layer to overlap the sub-pixel electrode;

a first metal bank layer disposed on the insulating layer, wherein a first opening is defined through the first metal bank layer to overlap the sub-pixel electrode;

a second metal bank layer disposed on the first metal bank layer, wherein an opening is defined through the second metal bank layer to overlap at least a portion of the first opening;

an intermediate insulating layer disposed between the first metal bank layer and the second metal bank layer and including an insulating material, wherein an opening is defined through the intermediate insulating layer to overlap at least a portion of the first opening;

an emission layer overlapping the sub-pixel electrode and disposed in the first opening of the first metal bank layer;

an opposite electrode overlapping the emission layer and disposed in the first opening of the first metal bank layer; and a first inorganic encapsulation layer disposed on the opposite electrode.

2. The display device of claim 1, wherein the intermediate insulating layer includes an inorganic insulating material.

3. The display device of claim 2, wherein the intermediate insulating layer includes at least one selected from silicon oxide and silicon nitride.

4. The display device of claim 1, further comprising:

a protective layer disposed on at least a portion of the sub-pixel electrode.

5. The display device of claim 1, wherein a width of the opening of the intermediate insulating layer and a width of the opening of the second metal bank layer are each less than a width of the first opening of the first metal bank layer.

6. The display device of claim 1, further comprising:

an intermediate layer disposed between the first metal bank layer and the intermediate insulating layer, wherein an opening is defined through the intermediate layer to overlap the first opening.

7. The display device of claim 6, wherein the second metal bank layer is in contact with an upper surface of the intermediate insulating layer, and includes a tip protruding toward a center of the first opening from a point at which a side surface of the intermediate layer is in contact with a bottom surface of the intermediate insulating layer.

8. The display device of claim 6, wherein the intermediate insulating layer is in contact with an upper surface of the intermediate layer, and includes a tip protruding toward a center of the first opening from a point at which a side surface of the intermediate layer is in contact with a bottom surface of the intermediate insulating layer.

9. The display device of claim 6, wherein the intermediate layer includes at least one selected from indium tin oxide, indium zinc oxide, indium gallium zinc oxide, indium tin zinc oxide, zinc oxide, aluminum doped zinc oxide, gallium doped zinc oxide, zinc tin oxide, gallium tin oxide, and fluorine doped tin oxide.

10. The display device of claim 1, further comprising:

a dummy emission layer and a dummy opposite electrode, which are disposed on an upper surface of the second metal bank layer and are respectively disconnected from the emission layer and the opposite electrode.

11. The display device of claim 10, wherein the first inorganic encapsulation layer continuously extends to overlap upper portions and side surfaces of the dummy emission layer and the dummy opposite electrode, side surfaces of the first metal bank layer, the intermediate insulating layer, and the second metal bank layer, and an upper surface of the opposite electrode.

12. The display device of claim 1, wherein the first inorganic encapsulation layer is arranged only in the first opening of the first metal bank layer.

* * * * *